(12) United States Patent
Huang et al.

(10) Patent No.: US 12,388,047 B2
(45) Date of Patent: Aug. 12, 2025

(54) INTEGRATED FAN-OUT PLATFORM AND MANUFACTURING METHOD FOR SEMICONDUCTOR DEVICES

(71) Applicant: Taiwan Semiconductor Manufacturing Company, Hsinchu (TW)

(72) Inventors: Li-Hsien Huang, Zhubei (TW); Hsueh-Lung Cheng, Hsinchu (TW); Yao-Chun Chuang, Hsinchu (TW); Yinlung Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 464 days.

(21) Appl. No.: 17/893,354

(22) Filed: Aug. 23, 2022

(65) Prior Publication Data

US 2024/0071998 A1 Feb. 29, 2024

(51) Int. Cl.
*H01L 25/065* (2023.01)
*H01L 23/00* (2006.01)
(Continued)

(52) U.S. Cl.
CPC ...... *H01L 25/0655* (2013.01); *H01L 23/3128* (2013.01); *H01L 23/49827* (2013.01);
(Continued)

(58) Field of Classification Search
CPC ............ H01L 25/0655; H01L 23/3128; H01L 23/49827; H01L 24/05; H01L 24/06; H01L 24/19; H01L 24/20; H01L 24/73; H01L 25/105; H01L 25/50; H01L 24/13; H01L 24/16; H01L 24/32; H01L 24/96; H01L 25/18; H01L 2224/05073; H01L 2224/05555; H01L 2224/05564; H01L 2224/05571; H01L 2224/05573; H01L 2224/05611; H01L 2224/05624; H01L 2224/05639; H01L 2224/05644; H01L 2224/05647; H01L 2224/05655; H01L 2224/05664; H01L 2224/06134; H01L 2224/13111; H01L 2224/13124; H01L 2224/13139; H01L 2224/13144; H01L 2224/13147; H01L 2224/13155;
(Continued)

(56) References Cited

U.S. PATENT DOCUMENTS

2020/0381361 A1\* 12/2020 Zhao ............... H01L 23/49816
2023/0245991 A1\* 8/2023 Chen ................... H01L 23/5386
257/774

\* cited by examiner

*Primary Examiner* — Fernando L Toledo
*Assistant Examiner* — Shawn Shaw Muslim
(74) *Attorney, Agent, or Firm* — Lippes Mathias LLP

(57) ABSTRACT

A method of packaging a semiconductor includes: positioning first and second semiconductor dies by one another on a carrier substrate, wherein first and second zones zone are defined with respect to the first die and third and fourth zones are defined with respect to the second die; forming first vias in the first zone, the first vias having a first size; forming second vias in the second zone, the second vias having a second size different from the first; forming third vias in the third zone, the third vias having a third size; forming fourth vias in the fourth zone, the fourth vias having a fourth size different from the third; and electrically connecting the first and second dies with an interconnection die such that electrical signals are exchangeable therebetween.

20 Claims, 17 Drawing Sheets

(51) Int. Cl.
  *H01L 23/31*   (2006.01)
  *H01L 23/498*  (2006.01)
  *H01L 25/00*   (2006.01)
  *H01L 25/10*   (2006.01)
  *H01L 25/18*   (2023.01)

(52) U.S. Cl.
  CPC .............. *H01L 24/05* (2013.01); *H01L 24/06* (2013.01); *H01L 24/19* (2013.01); *H01L 24/20* (2013.01); *H01L 24/73* (2013.01); *H01L 25/105* (2013.01); *H01L 25/50* (2013.01); *H01L 24/13* (2013.01); *H01L 24/16* (2013.01); *H01L 24/32* (2013.01); *H01L 24/96* (2013.01); *H01L 25/18* (2013.01); *H01L 2224/05073* (2013.01); *H01L 2224/05555* (2013.01); *H01L 2224/05564* (2013.01); *H01L 2224/05571* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/06134* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16258* (2013.01); *H01L 2224/19* (2013.01); *H01L 2224/2101* (2013.01); *H01L 2224/211* (2013.01); *H01L 2224/214* (2013.01); *H01L 2224/32245* (2013.01); *H01L 2224/73204* (2013.01); *H01L 2224/95001* (2013.01); *H01L 2224/96* (2013.01)

(58) Field of Classification Search
  CPC . H01L 2224/13164; H01L 2224/16258; H01L 2224/19; H01L 2224/2101; H01L 2224/211; H01L 2224/214; H01L 2224/32245; H01L 2224/73204; H01L 2224/95001; H01L 2224/96; H01L 2221/68331; H01L 21/6836
  See application file for complete search history.

INTEGRATED FAN-OUT PLATFORM AND MANUFACTURING METHOD FOR SEMICONDUCTOR DEVICES

BACKGROUND

The following relates to the semiconductor arts, and in particular, to an integrated fan-out (InFO) platform for a semiconductor device and/or a related manufacturing method and/or process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

FIGS. 1 through 16, in accordance with some embodiments disclosed herein, diagrammatically illustrate in cross-sectional views the arrangement of various semiconductor dies, devices, assemblies, components and/or packages at various stages of a semiconductor manufacturing process.

DETAILED DESCRIPTION

Figure 1:
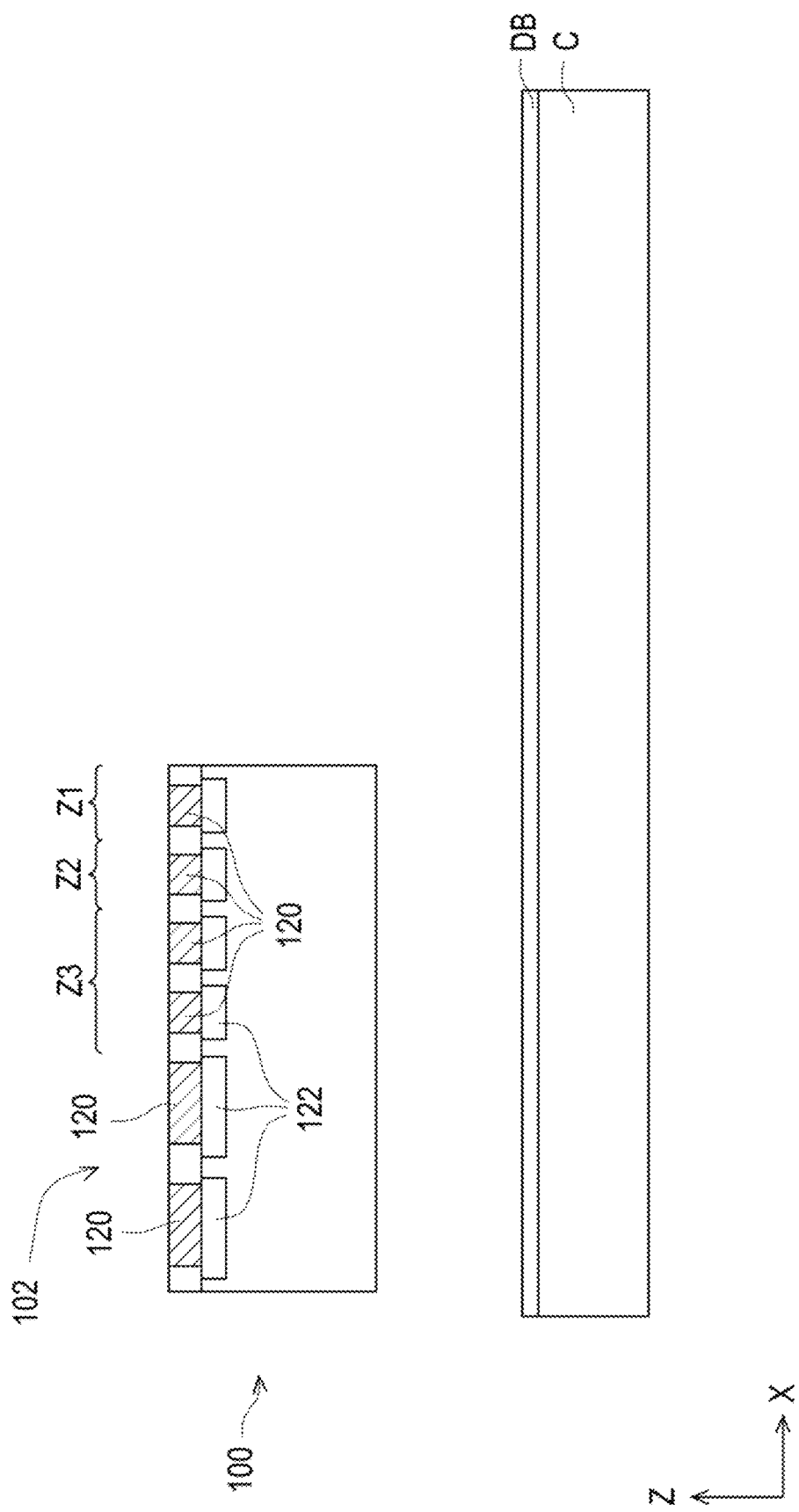
FIG. 1 through ##, in accordance with some embodiments disclosed herein, diagrammatically illustrate cross-sectional views of an integrated fan-out (InFO) platform package, including a semiconductor device assembly, at various stages of a suitable fabrication process for manufacturing the InFO platform package.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, there is disclosed herein an integrated fan-out (InFO) platform for semiconductor devices or packaging, which is a wafer level system integration technology, for example, featuring a high density re-distribution layer (RDL) and through vias for high-density interconnect and performance for various applications, for example, including but not limited to mobile devices, high performance computing, etc. A package-on-package (PoP) assembly of integrated circuit (IC) wafers or chips or dies has numerous advantages in providing a compact and low profile electronic assembly with high interconnects density and improved electrical and thermal performance. Embodiments disclosed herein provide InFO platform packages and corresponding manufacturing methods with improved robustness and which reduce or eliminate some failure modes.

In some suitable embodiments, a pair of semiconductor dies or packages, for example, each comprising a system on chip (SoC), are electrically connected through a local silicon interconnection (LSI) die overlapping a plurality of inter-communication zones on each semiconductor die or package. In suitable embodiments, vias used for electrical connections between the semiconductor dies or packages connected by the LSI die are formed and/or designed in the plurality of zones such a size (e.g., diameter or cross-sectional area) of the vias in the plurality of zones vary from zone to zone. Advantageously, such varied size in these via help reduce or eliminate some failure modes which potentially might otherwise be experienced during the manufacturing process. In some suitable embodiments, the differently sized vias may help mitigate against the cracking of aluminum or other like electrical pads as a result of stress that may otherwise develop or accumulate therein, for example, due to a co-efficient of thermal expansion (CTE) mismatch between materials, while still guarding against delamination that could potentially result during thermal cycling if relatively larger vias were used to mitigate the aforementioned cracking problem.

Figure 16:
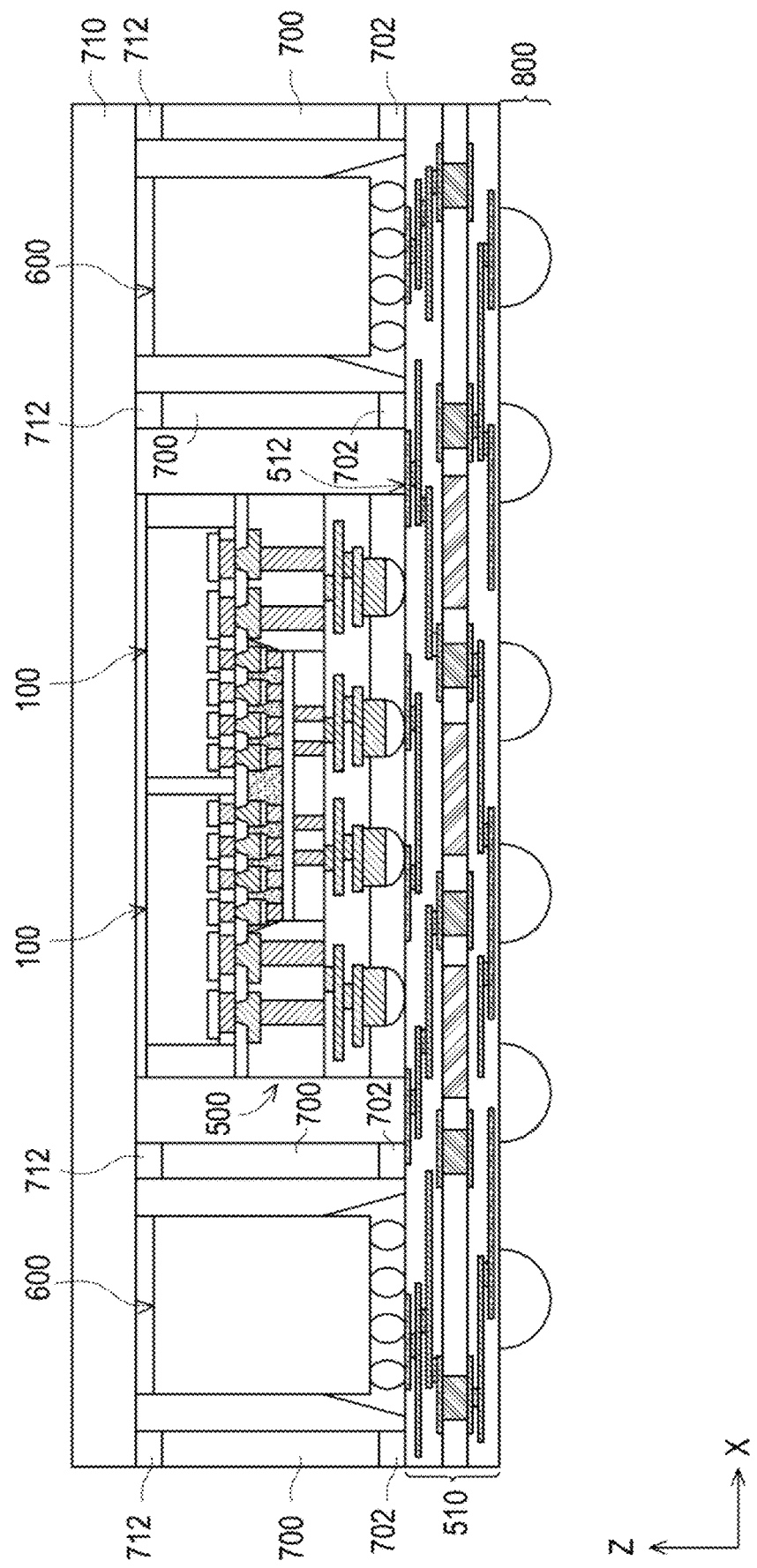
Figure 17:
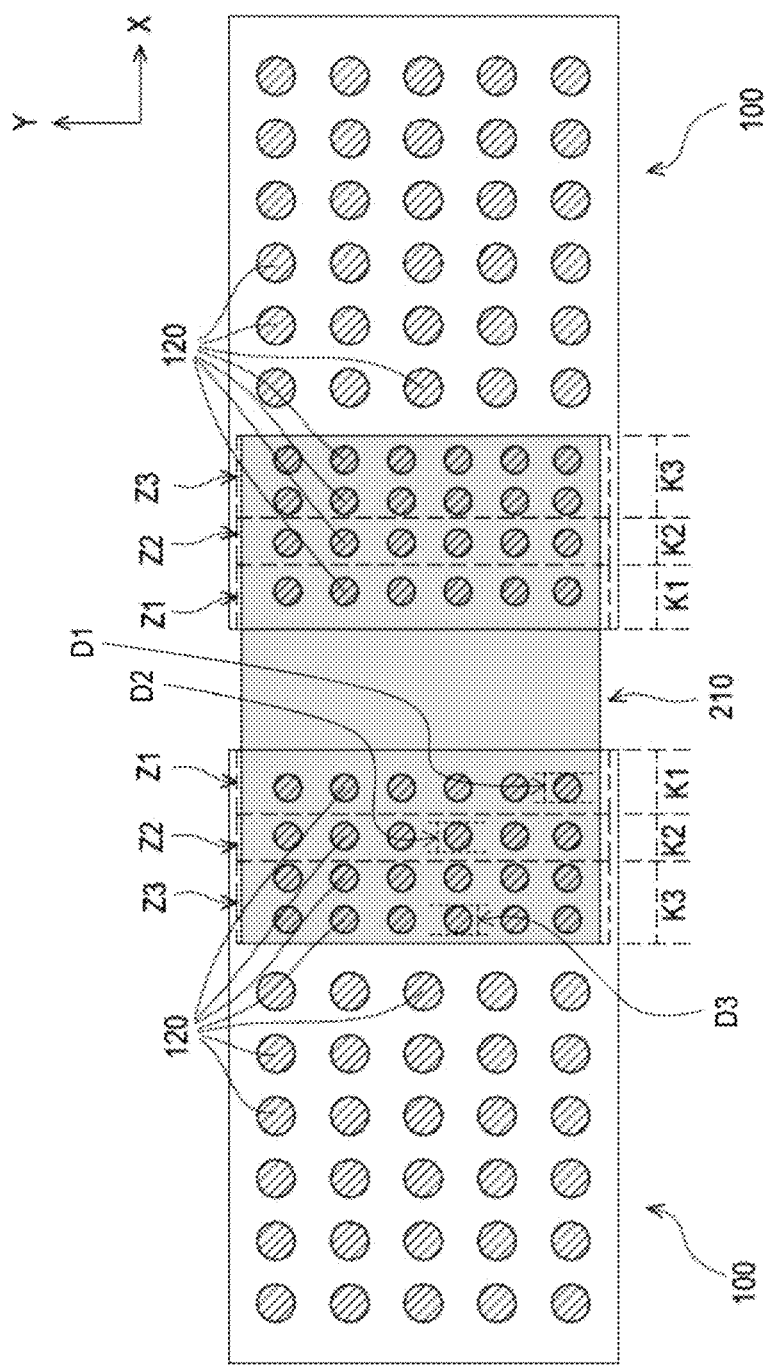
FIG. 17 diagrammatically illustrates a top plan view of a pair of semiconductor dies or packages which are connected by a local silicon interconnection (LSI) die in accordance with some embodiments disclosed herein.

FIGS. 1 through 17 show various views of an integrated fan-out (InFO) platform package including a semiconductor device assembly in accordance with some suitable embodiments described herein. More specifically, the various FIGURES show the InFO platform package at various stages of a suitable process for forming or otherwise constructing or producing the same, for example, where such process may include a number of intermediate steps. In some suitable embodiments, the semiconductor device assembly may include a plurality of semiconductor dies or packages 100. In some suitable embodiments, as shown in FIG. 2 for example, the semiconductor device assembly may include at least two semiconductor dies or packages 100. Suitably, as shown in FIGS. 7 and 17 for example, the two semiconductor dies or packages 100 may be electrically connected with one another through an interconnection die 200, also referred to herein as a silicon interconnection die 200 or as a local silicon interconnection (LSI) die 200, disposed on and/or over the two semiconductor dies or packages 100. In some suitable embodiments, the LSI die 200 electrically connects the at least two semiconductor dies or packages 100 such that electrical signals may be selectively exchanged between the at least two electrically connected semiconductor dies or packages 100.

For ease of reference and illustrative purposes herein, the FIGURES and the various elements and/or components depicted therein are shown relative to an otherwise arbitrarily chosen three-dimensional (3D) cartesian coordinate system including X, Y and Z axes as shown in the FIGURES. While consistency is maintained among and/or across the various FIGURES (unless otherwise explicitly noted), it is to be appreciated the directions and/or orientations indicated by these axes are chosen primarily for the purpose of facilitating the description provided herein, for example, to describe and/or identify relative orientations and/or directions. Unless otherwise indicated, the illustrated coordinate system and/or axes, in and of themselves, are not intended to be limiting and should not be read or interpreted as such.

Figure 2:
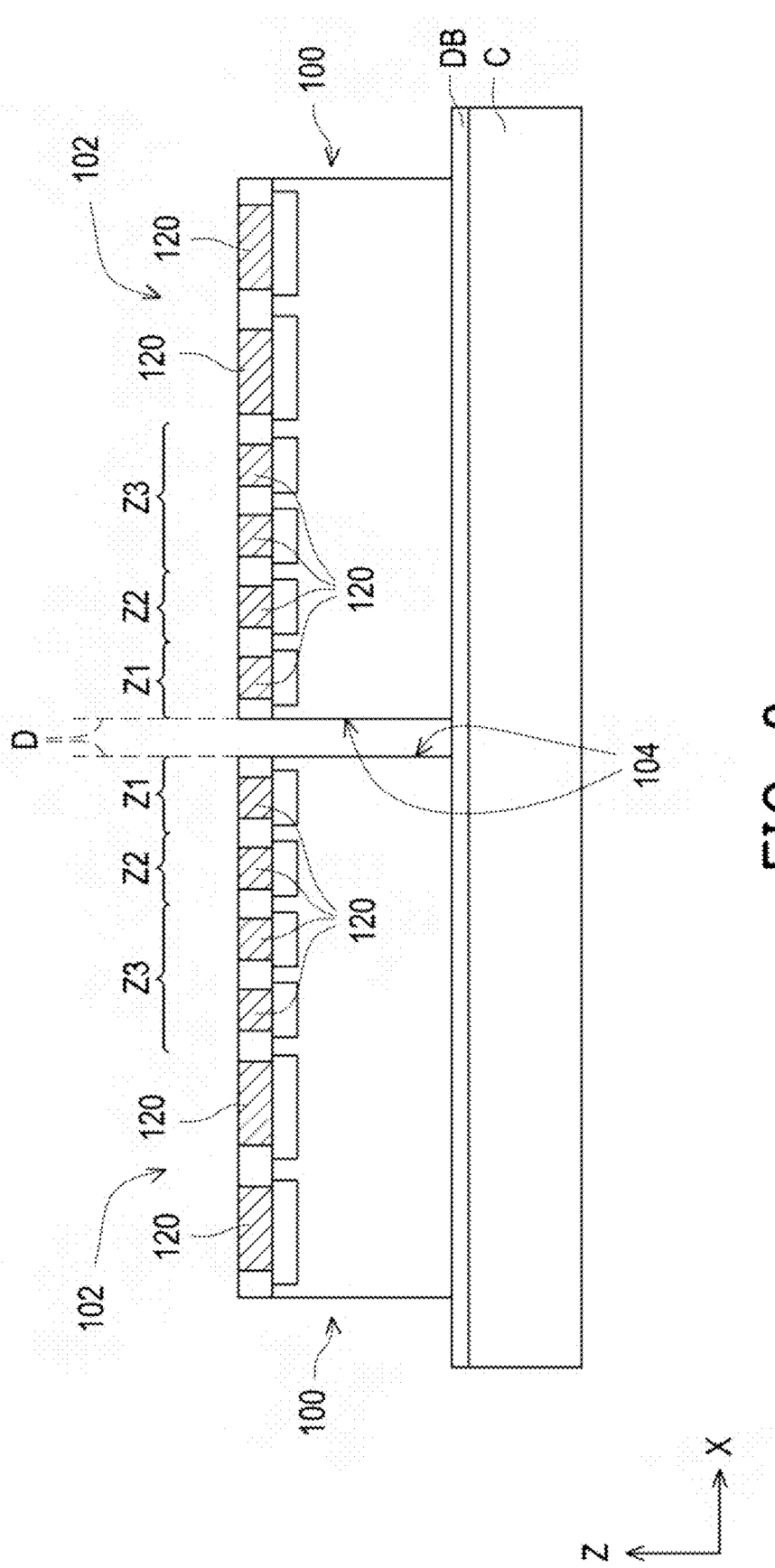

Referring now to FIG. 1, a temporary carrier substrate C is shown and/or provided, for example, with a de-bonding layer DB formed on a side of the carrier substrate C. In some suitable embodiments, the carrier substrate C may be a glass carrier substrate, a ceramic carrier substrate, or other like carrier material used in the manufacture of semiconductors. Suitably, the carrier substrate C may be, for example, a wafer, such that a plurality of semiconductor dies or packages, for example, such as the illustrated semiconductor die or package 100, can be disposed on and/or formed over the carrier substrate C. In some suitable embodiments, the semiconductor die or package 100 may comprise, for example, a system on chip (SoC) or other integrated circuit (IC) or the like. As shown in FIG. 2, for example, a plurality of semiconductor dies or packages 100 are disposed on and/or formed over the carrier substrate C. More specifically, in the illustrated non-limiting example, FIG. 2 shows two semiconductor dies or packages 100 disposed on and/or formed over the carrier substrate C.

In some suitable embodiments, the de-bonding layer DB may be formed of a polymer-based material, which may eventually (for example, in subsequent steps) be removed, along with the carrier substrate C, from the overlying structures disposed and/or formed thereon. In some suitable embodiments, the de-bonding layer DB is an epoxy-based thermal-release material, which loses its adhesive property when heated, for example, such as a light-to-heat-conversion (LTHC) release coating. In other suitable embodiments, the de-bonding layer DB may be an ultra-violet (UV) glue, which loses its adhesive property when exposed to UV light. The de-bonding layer DB may be dispensed as a liquid onto the carrier substrate C and cured, may be a laminate film laminated onto the carrier substrate C, or may be the like. In practice, a top surface (i.e., the surface distal from the carrier substrate C) of the de-bonding layer DB may be leveled and may have a high degree of planarity.

In some suitable embodiments, for example, as shown in FIG. 2, the plurality of semiconductor dies or packages 100 are placed side by side on and/or over the de-bonding layer DB of the carrier substrate C, for example, using a suitable pick and place (PnP) process carried out by a PnP tool, an automated material handling system (AMHS), an equipment front end module (EFEM), a robotic arm, or the like.

In some suitable embodiments, one or more of the semiconductor dies or packages 100 may be a logic die (for example, such as central processing unit, microcontroller, etc.), a memory die (for example, such as a dynamic random access memory (DRAM) die, a static random access memory (SRAM) die, etc.), a power management die (for example, such as a power management integrated circuit (PMIC) die), a radio frequency (RF) die, a micro-electro-mechanical-system (MEMS) die, a signal processing die (for example, such as a digital signal processing (DSP) die), a front-end die (for example, such as an analog front-end (AFE) die), a SoC die or other integrated circuit (IC) die, or combinations thereof. In some suitable embodiments, one or more of the semiconductor dies or packages 100 may comprise a photoelectric integrated circuit or optical integrated circuit or photonic IC (PIC) die, for example, which may include one or more photo-detectors (for example, such as photo-diode arrays), one or more optical signal sources (for example, such as laser or light emitting diodes), or combinations thereof.

In some embodiments, for example, where optical transmitters may be fabricated in an InFO platform package, one or more PIC dies, such as optical signal sources, and/or one or more IC dies, such as SoC transmitter (Tx) dies, memory dies and drivers, may be placed over the de-bonding layer DB. For example, the optical signal sources may include laser diodes, such as vertical-cavity surface-emitting laser (VCSEL) diodes or the like; and the memory dies may include DRAM dies, SRAM dies or the like. In some embodiments, for example, where optical receivers may be fabricated in an InFO platform package, a one or more PIC dies, such as photo-detectors, and/or one or more IC dies, such as SoC receiver (Rx) dies, memory dies and amplifiers, may be placed over the de-bonding layer DB. For example, the photo-detectors may include photo-diodes; the memory dies may include DRAM dies, SRAM dies or the like; and the amplifiers may include transimpedance amplifiers (TIA) or the like. In some embodiments, for example, where optical transceivers may be fabricated in an InFO platform package, one or more PIC dies, such as photo-detectors and optical signal sources, and/or one or more IC dies, such as SoC (Rx) dies, SoC (Tx) dies, memory dies, drivers and amplifiers, may be placed over the de-bonding layer DB. For example, the photo-detectors may include photo-diodes; the optical signal sources may include laser diodes, such as VCSEL diodes or the like; the memory dies may include DRAM dies, SRAM dies or the like; and the amplifiers may include transimpedance amplifiers (TIA) or the like.

In some suitable embodiments, for example, the semiconductor dies or packages 100 may each include a semiconductor substrate, for example, with devices such as transistors, diodes, capacitors, resistors, etc., formed in and/or on the semiconductor substrate. In practice, the aforementioned devices may be interconnected by interconnect structures formed by, for example, metallization patterns in one or more dielectric layers on the semiconductor substrate to form an IC or SoC. The semiconductor dies or packages 100 may further comprise surface metallization areas, referred to herein as pads, such as aluminum pads, to which external electrical connections are made. Suitably, the pads are on or near what may be referred to as respective active sides 102 of the semiconductor dies or packages 100, and may be in or near the uppermost layers of the interconnect structures.

As shown, in FIG. 1 for example, each semiconductor die or package 100 may have formed therein or otherwise include a plurality electrically conductive vias 120 extending away from an active side 102 of semiconductor die or package 100, for example, to surface metallization areas or pads 122. In some suitable embodiments, the conductive vias 120 may be formed from an electrically conductive material such as solder, copper (Cu), aluminum (Al), gold (Au), nickel (Ni), silver (Ag), palladium (Pd), tin (Sn), or another metal or other suitable electrically conductive material or the like, or a combination thereof. In some suitable embodiments, the conductive vias 120 are copper posts extending away from the active side 102 of the semiconductor die or package 100, for example, in a direction of the Z-axis. In some suitable embodiments, the vias 120 may be located in distinct zones or regions or areas defined on the active side 102 of the semiconductor die or package 100. In practice, each semiconductor die or package 100 may include plurality of such zones. As shown in FIG. 2 for example, each semiconductor die or package 100 may include three distinct zones Z1, Z2 and Z3.

In some suitable embodiments, as shown in FIG. 2 for example, a first semiconductor die or package 100 is situated next to or adjacent to a second semiconductor die or package 100 with the proximate ends 104 of the respective semiconductor dies or packages 100 facing and spaced apart from one another. As shown, the end 104 of the first semiconductor die or package 100 is spaced apart from the end 104 of the second semiconductor die or package 100 by a distance D, for example, as measured in a direction of the X-axis. In some suitable embodiments, the distance D may be in a range of between about 60 micrometers (μm) and about 200 μm, inclusive.

In some suitable embodiments, the three distinct zones Z1, Z2 and Z3 of each semiconductor die or package 100 are defined and/or arranged adjacent one another successively or consecutively from the respective facing ends 104 of the corresponding semiconductor dies or packages 100. That is to say, as shown, the first zone Z1 of each semiconductor die or package 100 is defined and/or arranged adjacent or otherwise proximate to the end 104 of its associated semiconductor die or package 100; the second zone Z2 of each semiconductor die or package 100 is defined and/or arranged adjacent or otherwise proximate to first zone Z1 of the semiconductor die or package 100; and the third zone Z3 of each semiconductor die or package 100 is defined and/or arranged adjacent or otherwise proximate to the second zone Z2, i.e., such that the second zone Z2 resides between the first zone Z1 and the third zone Z3.

As shown in FIG. 17 for example, each of the zones Z1, Z2 and Z3 on each of the semiconductor dies or packages 100 may contain or encompass or include a plurality of the vias 120 formed in the semiconductor die or package 100. Notably, in some suitable embodiments, the size of the vias 120 may vary from zone to zone. That is to say, a size of the vias 120 in at least one of the zones Z1, Z2 and/or Z3 is different than the size of the vias 120 in at least one other of the zones Z1, Z2 and/or Z3. In this context, for example, for cylindrical, round or circular or substantially cylindrical, round or circular vias 120, size may refer to a diameter of the vias 120, or alternately, for example, for other shapes of vias 120, size may refer to a width, cross-sectional area, or other dimension of the vias 120, for example, measured in a direction normal to the end 104 of the corresponding semiconductor die or package 100, i.e., measure in the direction of the X-axis. In some suitable embodiments, the size of the conductive vias 120 in the first zone Z1 may be less than the size of the conductive vias 120 in the second zone Z2; and the size of the conductive vias 120 in the second zone Z2 may be less than the size of the conductive vias 120 in the third zone Z3. In some suitable embodiments, the size of the conductive vias 120 in the third zone Z3 may be less than the size of the remaining conductive vias 120, for example, outside of zones Z1, Z2, and Z3. In some suitable embodiments, as shown in FIG. 17 for example, the vias 120 are cylindrical or substantially cylindrical, and in the first zone Z1 of each die or package 100 each via 120 has a diameter D1, and in the second zone Z2 of each die or package 100 each via 120 has a diameter D2, and in the third zone Z3 of each die or package 100 each via 120 has a diameter D3, where D1<D2<D3. Further as shown in FIG. 17, the zone Z1 for each die or package 100 may have a width K1, the zone Z2 for each die or package 100 may have a width K2 and the zone Z3 for each die or package 100 may have a width K3, for example, measured in a direction of the X-axis.

As previously mentioned herein, the two semiconductor dies or packages 100 may be electrically connected with one another through a local silicon interconnection (LSI) die 200 disposed on and/or over the two semiconductor dies or packages 100 such that electrical signals may be selectively exchanged between the two electrically connected semiconductor dies or packages 100. Suitably, the LSI die 200 is disposed on the active sides 102 of the first semiconductor die or package 100 and the second semiconductor die or package 100 respectively, for example as shown in FIGS. 7 and 17, such that the LSI die 200 overlaps the zones Z1, Z2 and Z3 on the active side 102 of the first semiconductor die or package 100 and the zones Z1, Z2 and Z3 on the active side 102 of the second semiconductor die or package 100. The shadow box or outline 210 shown in FIG. 17 diagrammatically represents the aforementioned overlap. In practice, the LSI die 200 may provide an electrical connection between one or more conductive vias 120 in zones Z1, Z2 and/or Z3 of the first semiconductor die or package 100 and one or more conductive vias 120 in zones Z1, Z2 and/or Z3 of the second semiconductor die or package 100, such that electrical signals or the like may be exchanged and/or routed therethrough from one semiconductor die or package 100 to the other semiconductor die or package 100. In some suitable embodiments, a first die (for example, such as the semiconductor die or package 100) has a first side, a first area (for example, such as zone Z1) on the first side and a second area (for example, such as zone Z2) on the first side; a second die (for example, also such as the semiconductor die or package 100) having a second side, a third area (for example, such as zone Z1) on the second side and a fourth area (for example, such as zone Z2) on the second side; a plurality of first electrically conductive vias (for example, such as vias 120) electrically contacting and extending away from the first side of the first die in the first area, each of the first vias having a first size; a plurality of second electrically conductive vias (for example, such as vias 120) electrically contacting and extending away from the first side of the first die in the second area, each of the second vias having a second size, the second size being greater than the first size; a plurality of third electrically conductive vias (for example, such as vias 120) electrically contacting and extending away from the second side of the second die in the third area, each of the third vias having a third size; a plurality of the fourth electrically conductive vias (for example, such as vias 120) electrically contacting and extending away from the second side of the second die in the fourth area, each of the fourth vias having a fourth size, the fourth size being greater than the third size; and a silicon interconnection die (for example, such as LSI die 200) disposed on the first and second sides of the first and second dies respectively, wherein the silicon interconnection die overlaps the first and second areas on the first side of the first die and the third and fourth areas on the second side of the second die and the silicon interconnection die is electrically connected such that electrical signals are selectively exchangeable between the first and second dies through at least one or more of the plurality of first vias, the plurality of second vias, the plurality of third vias and the plurality of fourth vias.

Figure 3:
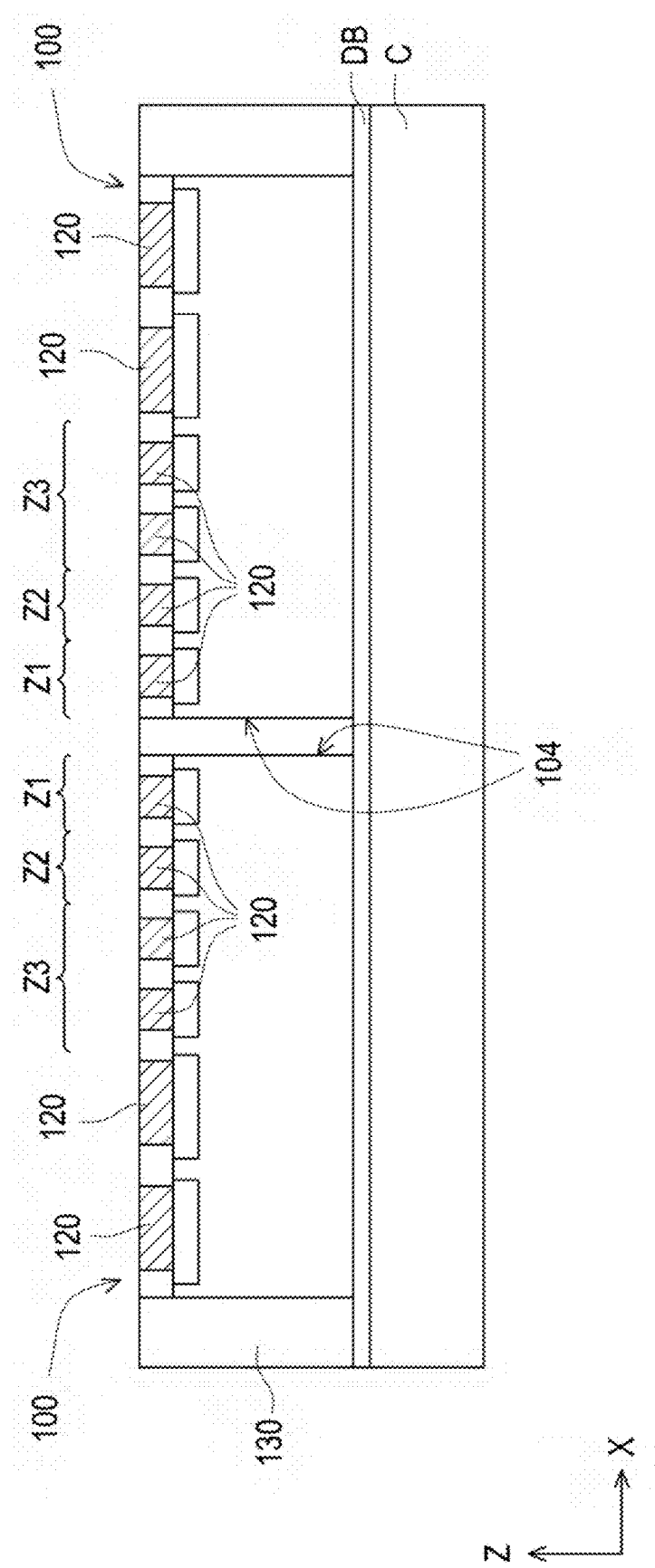

With reference now to FIG. 3, following placement and/or mounting of the plurality of semiconductor dies and/or packages 100 onto the temporary carrier substrate C, a molding 130, for example forming a dielectric interlayer, is provided around the semiconductor dies and/or packages 100. In some suitable embodiments, the dielectric interlayer and/or molding 130 comprises a molding material that is molded and/or otherwise formed around the semiconductor dies and/or packages 100. The molding material may be a dielectric and/or may comprise a resin or other suitable polymer and silica or other suitable filler, as a nonlimiting illustrative example. In one suitable manufacturing approach, the semiconductor dies and/or packages 100 are placed on the temporary carrier substrate C provided with the de-bonding layer DB using a pick-and-place (PnP) or other like attachment or mounting process. Suitably, following the PnP placement, the molding 130 is formed around the semiconductor dies or packages 100, and upper surfaces of the molding 130 and/or mounted semiconductor dies or packages 100 (i.e., surfaces opposite the temporary carrier substrate C) are ground and/or otherwise planarize, for example, to make them flush or substantially flush with one another.

Figure 4:
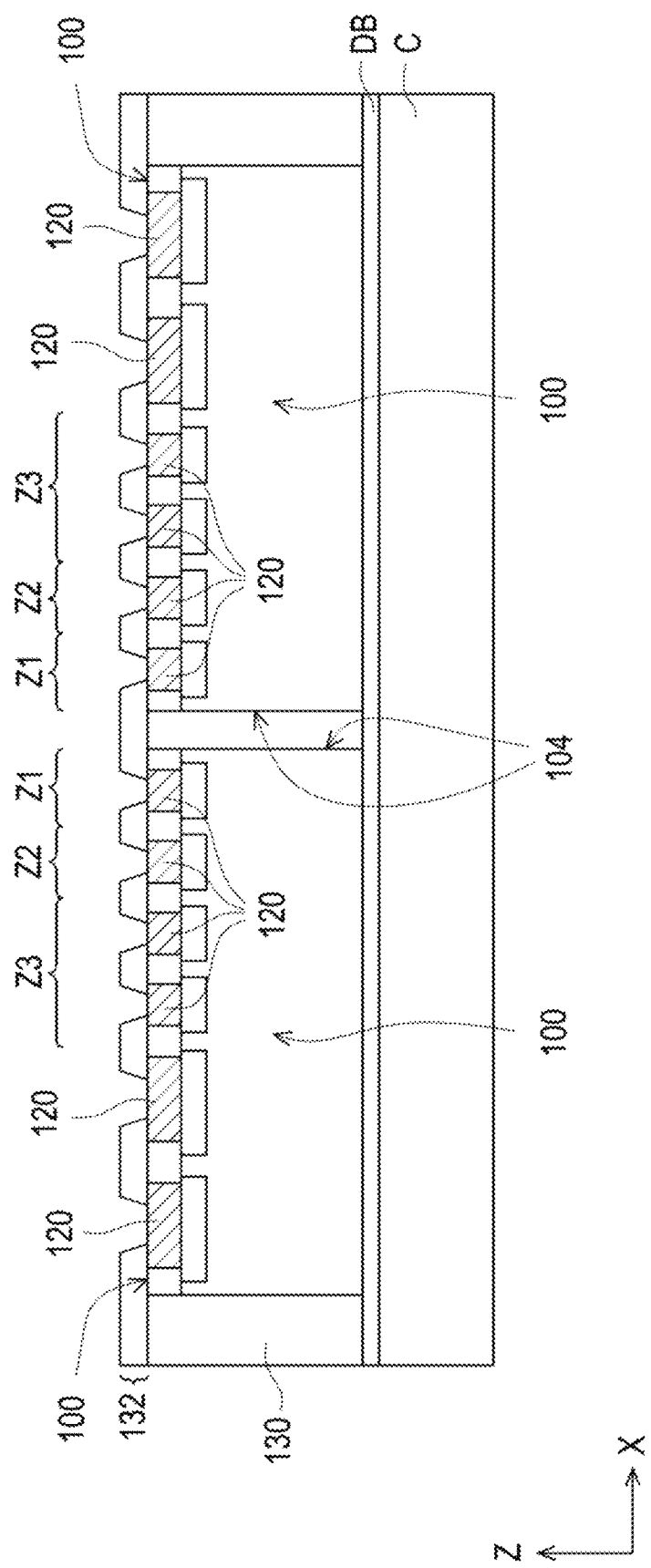

With reference now to FIG. 4, is some suitable embodiments, a polyamide or other suitable material layer 132 may be formed or otherwise disposed over the upper surface (i.e., the surface opposite the carrier substrate C) of the assembly shown in FIG. 3. For example, without limitation, the layer 132 may be formed of a polyamide or polyimide material or other suitable thermoplastic elastomer or other suitable material or combination thereof. In practice, the layer 132 (for example as shown in FIG. 4) may include or have formed therein openings or the like which are co-located or aligned and/or sized to correspond to the conductive vias 120 of the underlying semiconductor dies or packages 100. Suitably, the layer 132 and/or opening therein may be formed by any suitable techniques, for example, including without limitation, a material deposition step such as chemical vapor deposition (CVD) or spin coating or other like material deposition process followed by suitable photolithograph to form the openings or another suitable selective material removal process. Accordingly, a top of the conductive vias 120 remain exposed under and/or are accessible through the openings included and/or formed in the layer 132.

In some suitable embodiments, some of the openings in the layer 132 may be in and/or overlie the zones Z1, Z2 and Z3. As shown in FIGS. 4 and 17 for example, each of the zones Z1, Z2 and Z3 may include a plurality of the opening formed in the layer 132. Notably, in some suitable embodiments, the size of the openings in the layer 132 may vary from zone to zone. That is to say, a size of the openings in the layer 132 in at least one of the zones Z1, Z2 and/or Z3 is different than the size of the opening in the layer 132 in at least one other of the zones Z1, Z2 and/or Z3. In some suitable embodiments, the size of the openings in the layer 132 in the first zone Z1 may be less than the size of the openings in the layer 132 in the second zone Z2; and the size of the openings in the layer 132 in the second zone Z2 may be less than the size of the openings in the layer 132 in the third zone Z3. In some suitable embodiments, the size of the openings in the layer 132 in the third zone Z3 may be less than the size of the remaining openings in the layer 132, for example, outside of zones Z1, Z2, and Z3.

Figure 5:
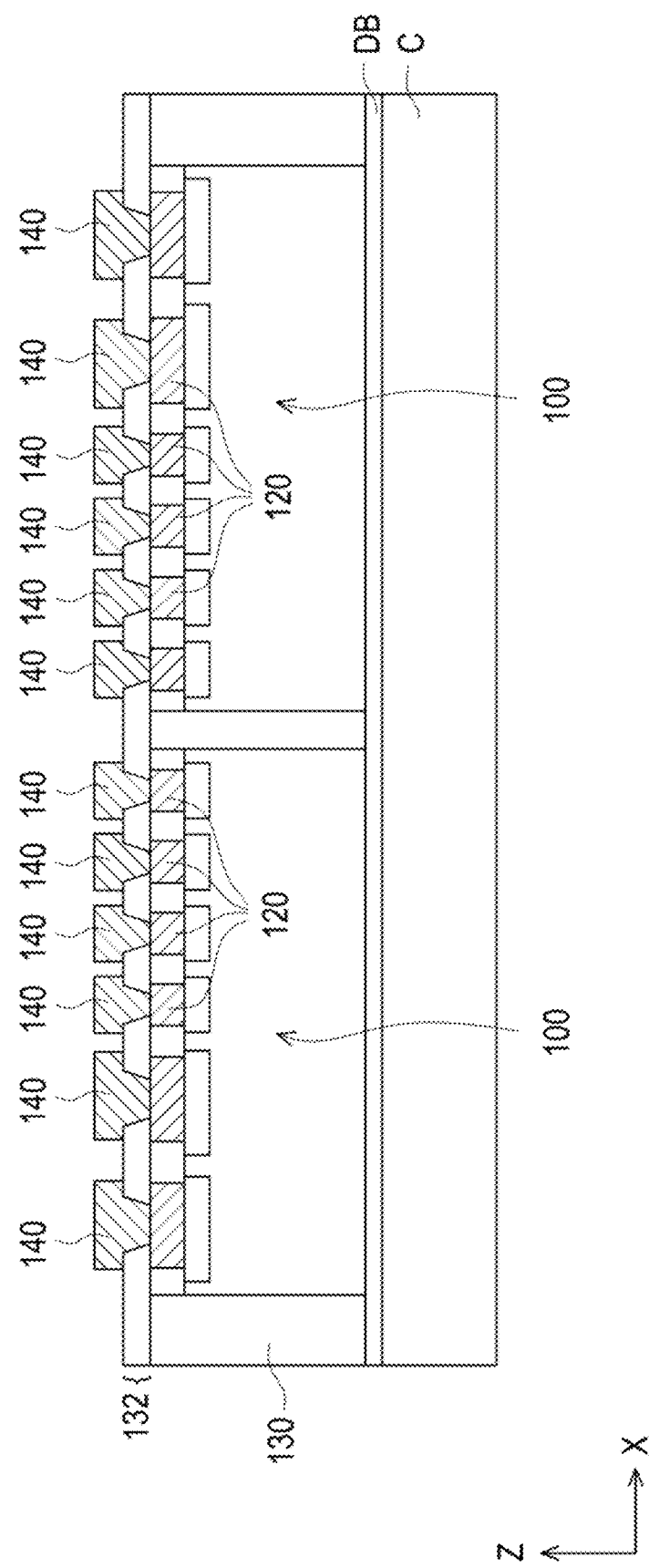

In some suitable embodiments, a micro-bump material layer (UBML) may be disposed and/or otherwise formed on and/or over the layer 132, as shown in FIG. 5 for example. In particular, the UBML may comprise a plurality of electrically conductive bumps 140. For example, as shown in FIG. 5, the bumps 140 are co-located or aligned with the openings in the layer 132. As non-limiting examples, the bumps 140 may be made from an electrically conductive material such as solder, eutectic, lead free, or high lead materials, or Cu, Al, Au, Ni, Ag, Pd, Sn, suitable metals or suitable electrically conductive material or the like, or a combination thereof. In some suitable embodiments, the bumps 140 fill and/or otherwise extend through the openings in the layer 132 to make electrical contact with the tops of the electrically conductive vias 120 in the semiconductor dies or packages 100. In practice, the UBML and/or bumps 140 may be created and/or formed using any one or more suitable process and/or technique commonly employed in the manufacturing and/or packaging of semiconductors and/or semiconductor devices.

Figure 6:
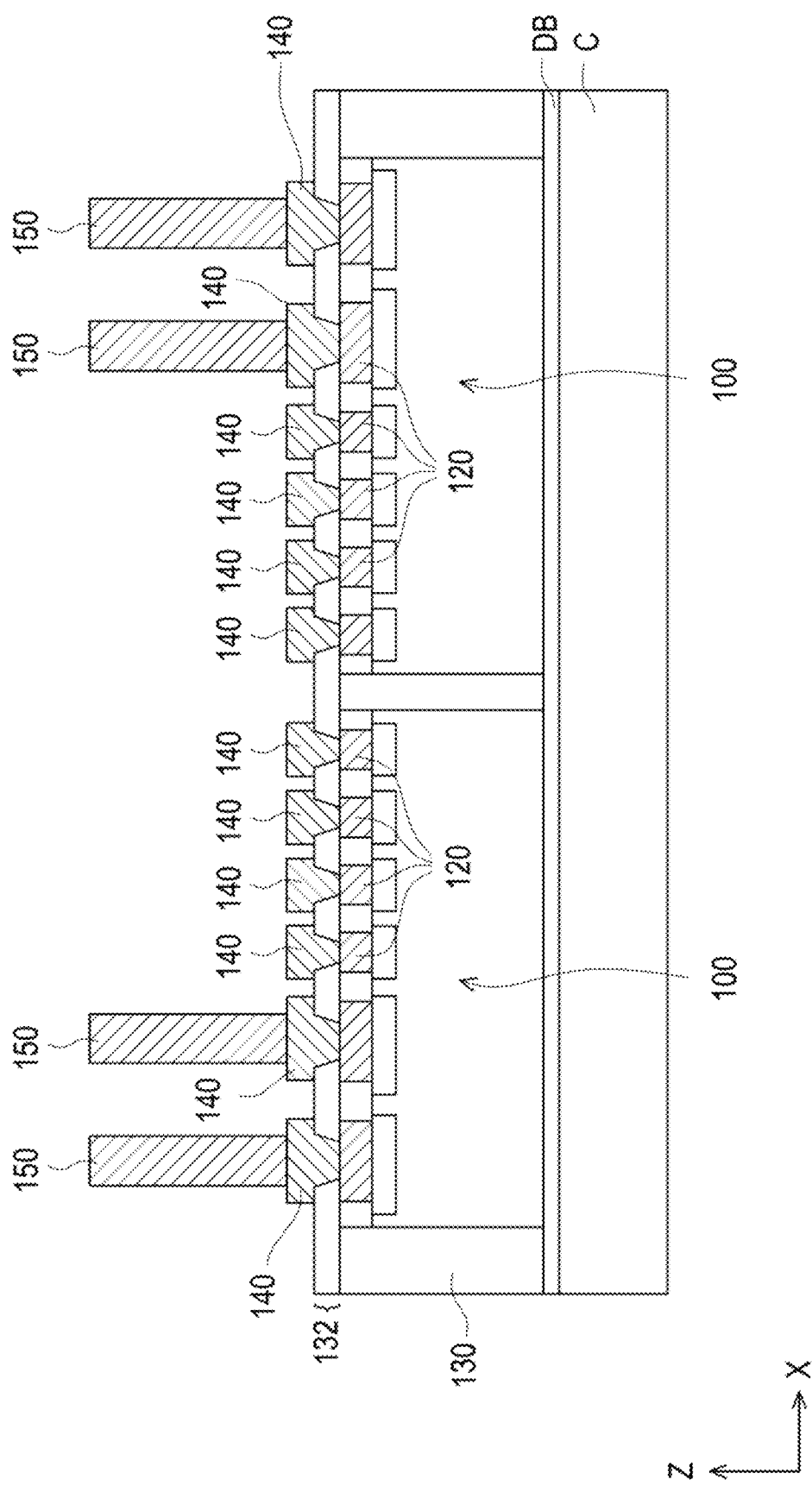
Figure 7:
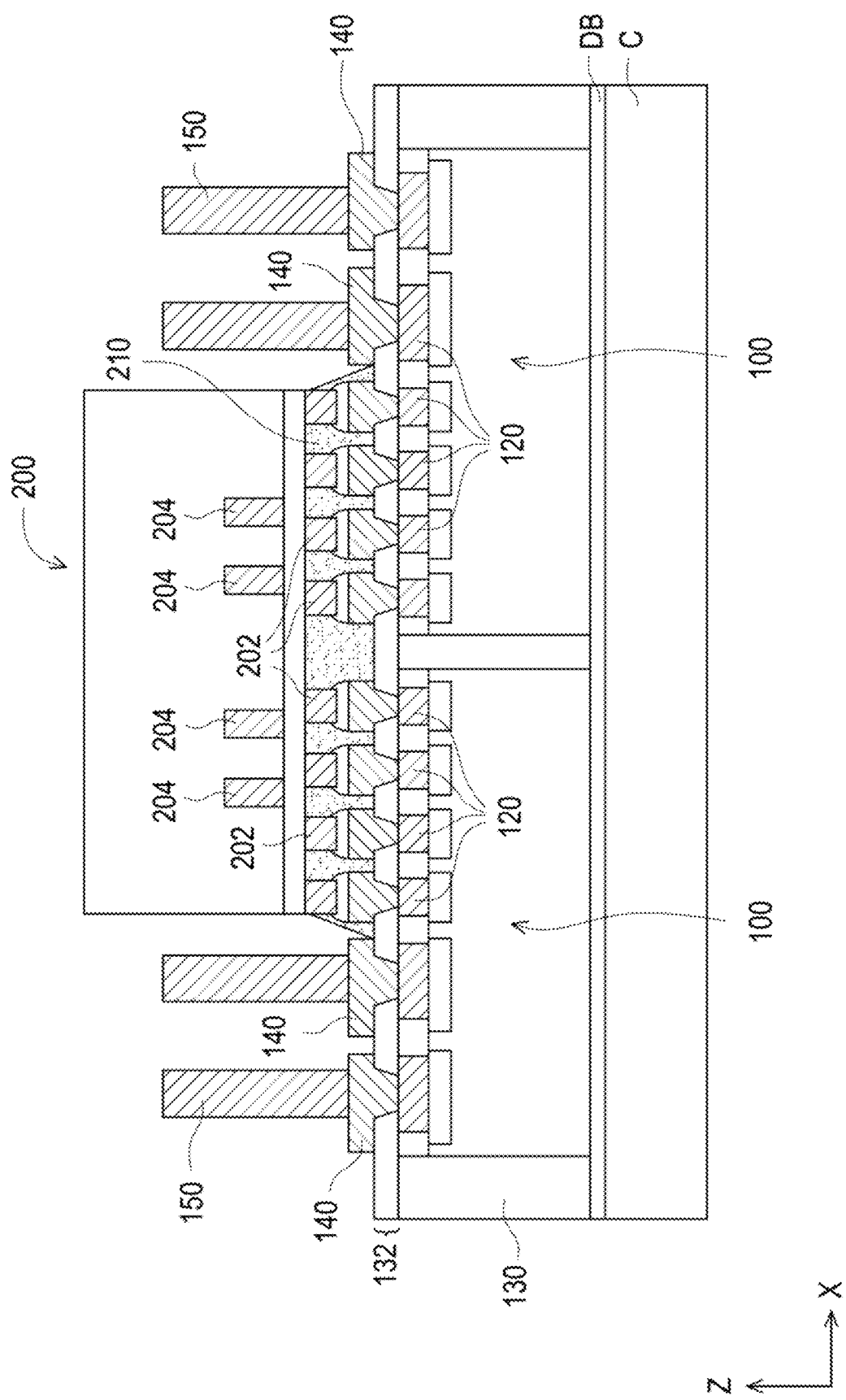
Figure 8:
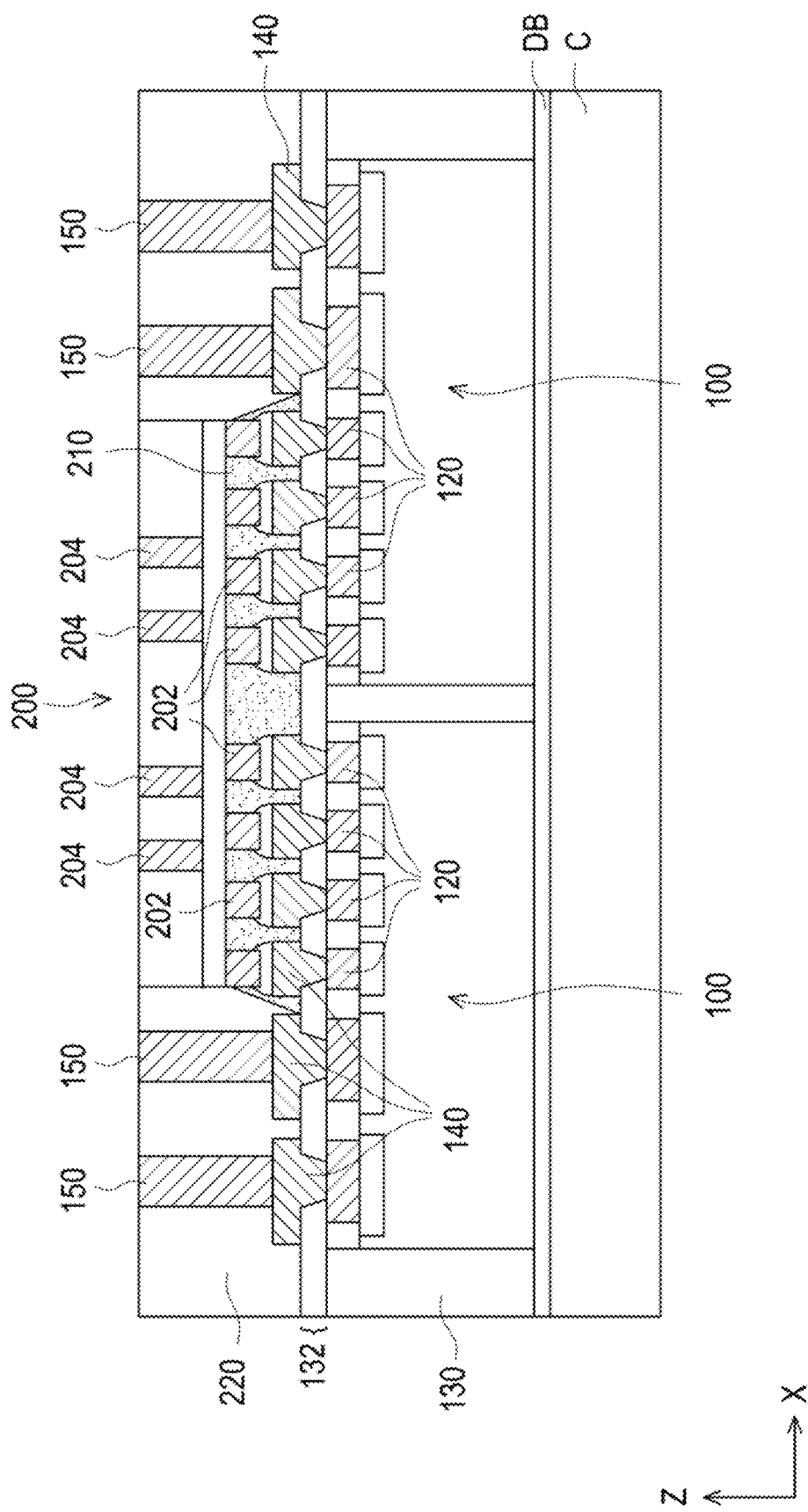

In some suitable embodiments, one or more electrically conductive through molding vias (TMVs) 150 may be disposed and/or otherwise formed on and/or over selected ones of the UBML bumps 140, as shown in FIG. 6 for example. Such TMVs 150 are referred to "through molding" vias insomuch as they will ultimately extend through a molding material, as shown in FIG. 8 for example. In some suitable embodiments, the TMVs 150 are outside and/or do not overlay the zones Z1, Z2 and Z3 and may be formed as Cu posts or the like, for example, vertically extending from selected UBML bumps 140 in a direction of the Z-axis. In other embodiments, the TMVs 150 may be made of other suitable metal or electrically conductive materials.

With reference now to FIG. 7, the LSI die 200 may be placed on and/or mounted to the assembly shown in FIG. 6. In some suitable embodiments, the LSI die 200 may include one or more patterned or otherwise formed electrically conductive interconnect layers or interconnects, for example, between and/or running through an interlayer dielectric (ILD), for example, without limitation, made of a silicon material and/or a suitable low dielectric constant (low-k) material. Suitably, the ILD may be formed in one or more layer. For example, without limitation, the interconnects may be made from an electrically conductive material such as Cu, Al, Au, Ni, Ag, Pd, Sn, suitable metals or suitable electrically conductive material or the like, or a combination thereof.

In some suitable embodiments, the LSI die 200 may also include one or more pads or electrical contacts 202 on or near a first side thereof. For example, without limitation, the pads or electrical contacts 202 may be made from an electrically conductive material such as Cu, Al, Au, Ni, Ag, Pd, Sn, suitable metals or suitable electrically conductive material or the like, or a combination thereof. Selected ones of these pads or electrical contacts 202 may be electrically connected to one or more selected through silicon vias (TSVs) 204 includes in the LSI die 200, for example, by the aforementioned interconnects of the LSI die 200. Such TSVs 204 are referred to "through silicon" vias insomuch as they will ultimately extend through a silicon material and/or through the LSI die 200, as shown in FIG. 8 for example. In some suitable embodiments, the TSVs 204 are Cu posts or the like, for example, vertically extending in a direction of the Z-axis. For example, without limitation, the TSVs 204 may be made from an electrically conductive material such as Cu, Al, Au, Ni, Ag, Pd, Sn, suitable metals or suitable electrically conductive material or the like, or a combination thereof.

As shown in FIG. 7 for example, a PnP process or other suitable placement and/or mounting process may be used to place and/or mount or otherwise dispose the LSI die 200 on the assembly shown in FIG. 6, such that one or more selected pads or electrical contacts 202 of the LSI die 200 may align with and be soldered or otherwise electrically connected to one or more selected UBML bumps 140 that electrically contact the vias 120 in zones Z1, Z2 and Z3 of the semiconductor dies or packages 100. In some suitable embodiments, an under fill 210 may be employed, for example, to provide structural support between the LSI die 200 and underlying structures. In practice, any suitable under fill material and/or deposition or application process commonly employed in the manufacturing and/or packaging of semiconductors or semiconductor devices may be used to create the under fill 210.

With reference now to FIG. 8, following the placement and/or mounting of the LSI die 200 and/or electrical connection thereof to the underlying semiconductor dies or packages 100, a second molding 220, for example forming a dielectric interlayer, is provided around the LSI die 200 and/or the TMVs 150. In some suitable embodiments, the dielectric interlayer and/or molding 220 comprises a molding material that is molded and/or otherwise formed around the LSI die 200 and/or the TMVs 150. The molding material may be a dielectric and/or may comprise a resin or other suitable polymer and silica or other suitable filler, as a nonlimiting illustrative example. In one suitable manufacturing approach, the LSI die 200 is placed using a suitable pick-and-place (PnP) process and/or other like attachment or mounting process. Suitably, following the PnP placement, the molding 220 is formed around the LSI die 200 and/or the TMVs 150, and upper surfaces of the molding 230, the placed and/or mounted LSI die 200 and/or the TMVs 150 (i.e., the surfaces opposite the temporary carrier substrate C) are ground and/or otherwise planarize, for example, to make them flush or substantially flush with one another. In some suitable embodiments, the aforementioned grinding and/or planarization may expose or uncover the TSVs 204 of the LSI die 200 so that electrical contact may be readily made therewith, for example, in subsequent steps of the manufacturing process.

Figure 9:
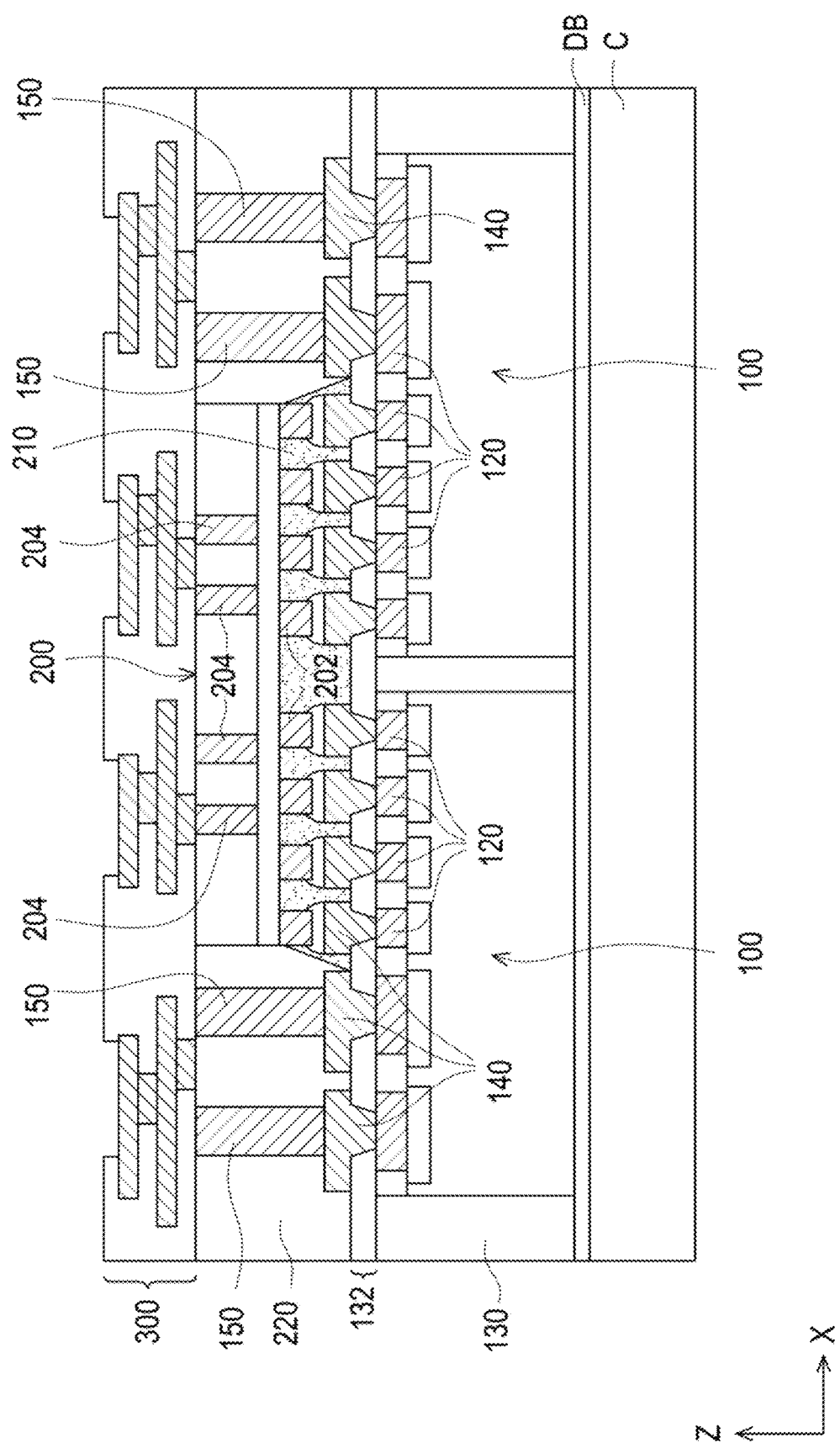

As shown in FIG. 9, in accordance with some suitable embodiments, a redistribution layer (RDL) 300 may be formed or otherwise disposed on and/or over the assembly shown in FIG. 8. In some suitable embodiments, the RDL 300 acts and/or functions to redistribute or laterally or otherwise re-locate electrical connection points to a selected one or more of the TSVs 204 and/or a selected one or more of the TMVs 150. For example, without limitation, the RDL 300 may include a plurality of patterned metal (or other electrically conductive) layers separated by interposed layers of a polymer or other dielectric material. In some embodiments, one nonlimiting illustrative processing sequence for forming the RDL 300 may include an iterative loop of processing steps in which each repetition of the loop may includes the following: (i) depositing a continuous polymer (or other dielectric) layer; (ii) forming openings in polymer layer by photolithography; (iii) Ti/Cu or any proper seed layer deposition; (iv) photo resist coating and lithography; and (v) forming an electrically conductive layer of the RDL 300 by copper (Cu) plating and photoresist stripping and seed layer removal.

Figure 10:
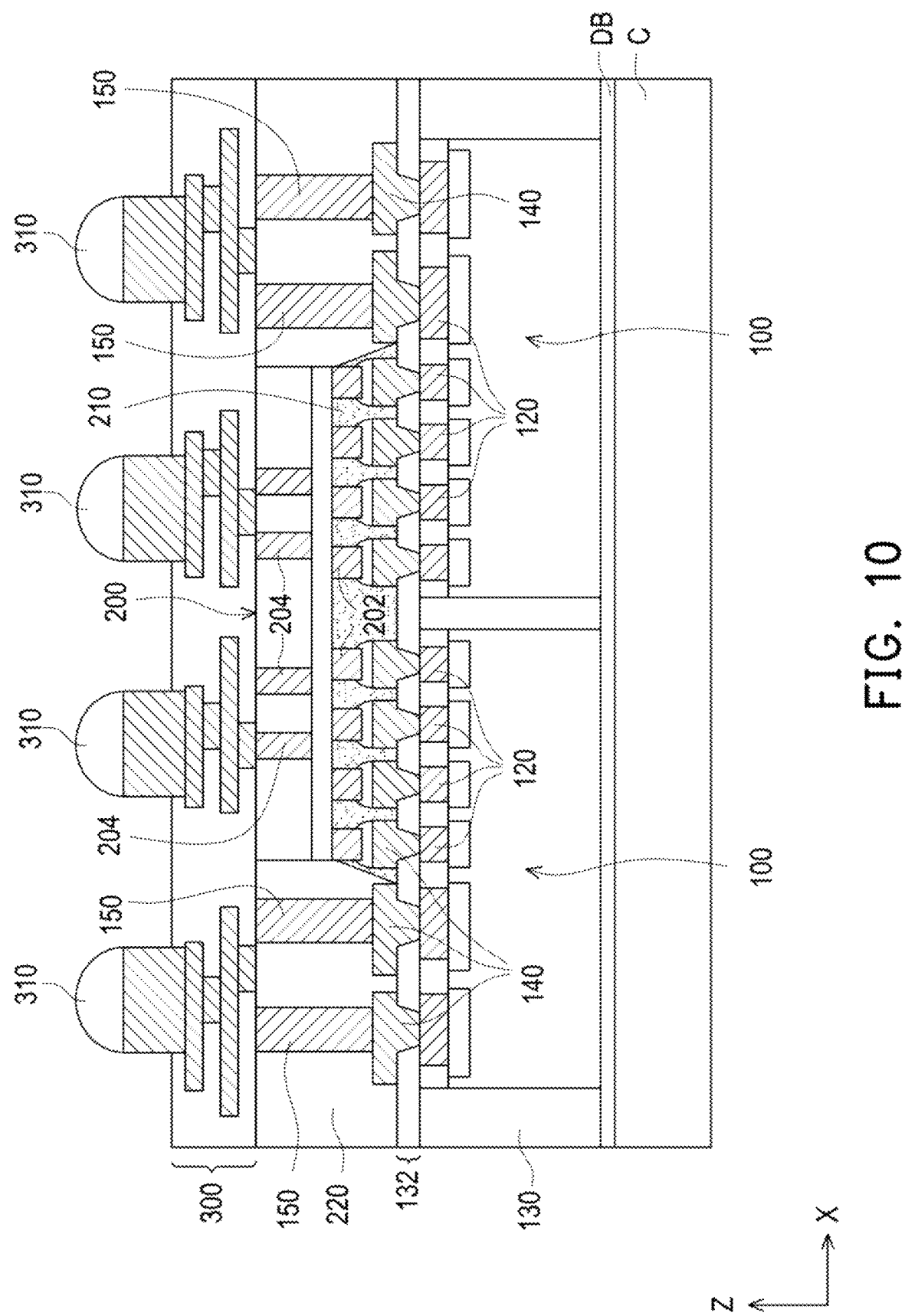

As shown in FIG. 10, in accordance with some suitable embodiments, an array or matrix of controlled collapse chip connection (C4) bumps 310 may be formed or otherwise disposed on and/or over the RDL 300. In practice, each C4 bump 310 may provide electrical access and/or connection to or electrical communication with a selected one or more of the TSVs 204 and/or a selected one or more of the TMVs 150 through the RDL 300.

For simplicity and/or clarity, various FIGURES herein depict only a single semiconductor assembly, including two semiconductor dies or packages 100 connected by an LSI die 200, formed and/or otherwise disposed on the temporary carrier substrate C. However, in practice, it is to be appreciated that a collection or plurality of such semiconductor assemblies may simultaneously be formed and/or disposed on the carrier substrate C and the collection or plurality of semiconductor assemblies may subsequently be separated from one another into individual semiconductor assemblies, i.e., with each individual semiconductor assembly including two semiconductor dies or packages 100 connected by an LSI die 200.

Figure 11:
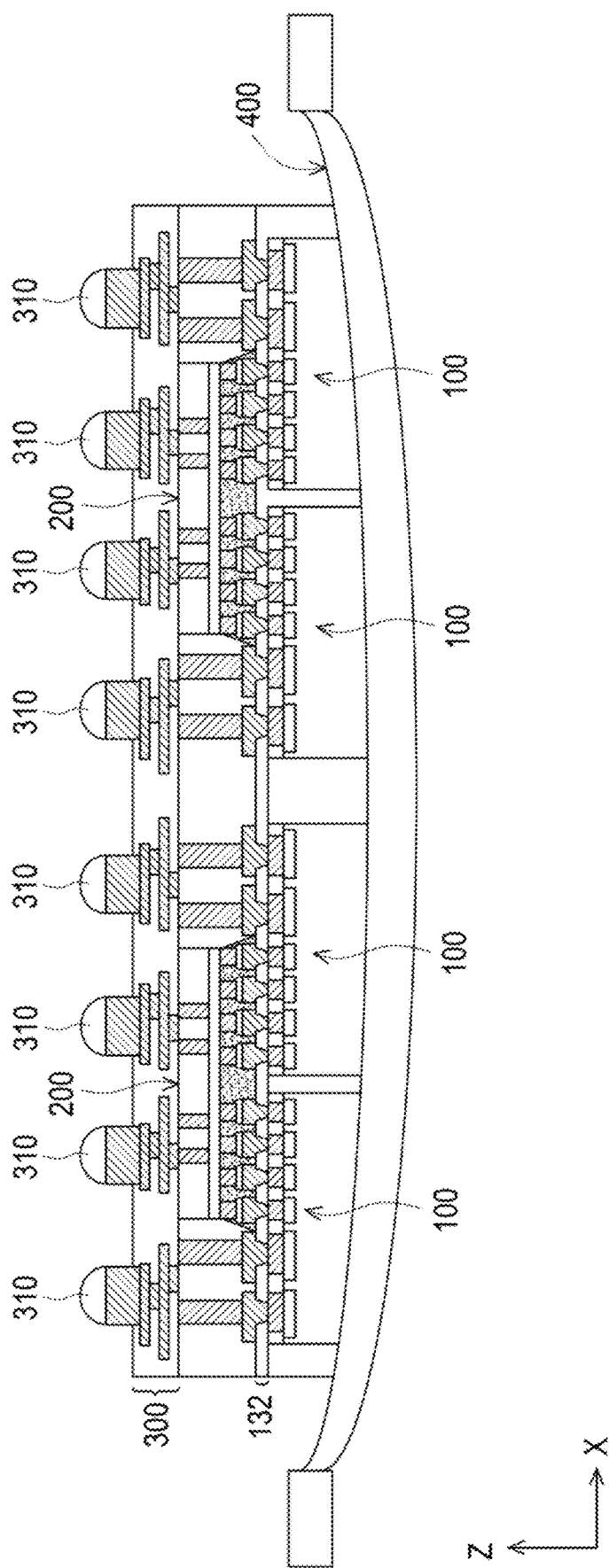
Figure 12:
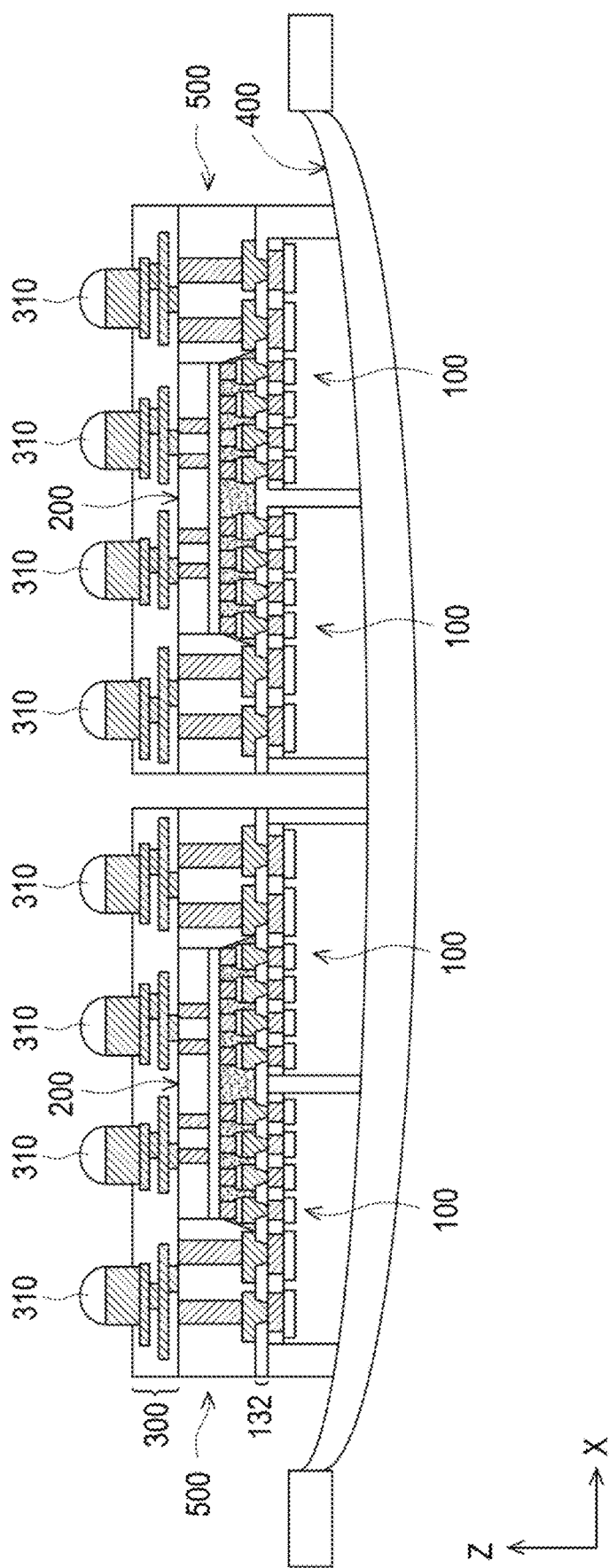

For example, with reference now to FIG. 11, in accordance with some suitable embodiments, a plurality of semiconductor assemblies (each including two semiconductor dies or packages 100 connected by an LSI die 200) are shown with the debonding layer DB, along with the carrier substrate C, having been removed. In practice, the debonding layer DB and the carrier substrate C may be removed from the structures thereon by suitable activation of the debonding layer DB to release the structures. As shown in FIG. 11, the still connected semiconductor assemblies (albeit now freed from the debonding layer DB and the carrier substrate C) are supported on an adhesive frame tape 400, for example, which may suitably be flexible. In some suitable embodiments, while so supported, a suitable dicing or sawing or other like process may be applied to separate the connected semiconductor assemblies into individual semiconductor assemblies or packages, which have been labeled with reference numeral 500 in FIG. 12.

Figure 13:
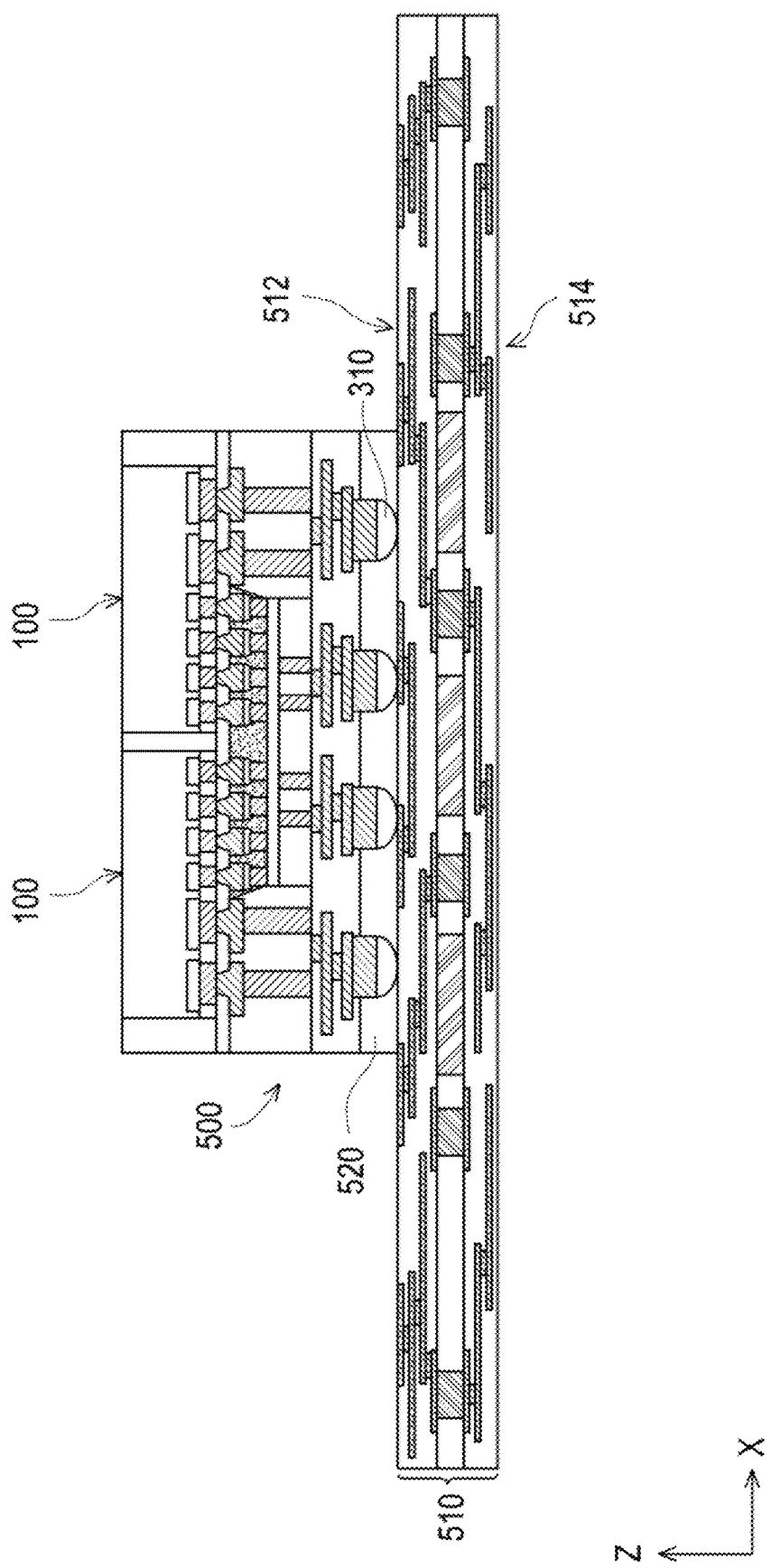

In some suitable embodiments, having been diced, sawn or otherwise separated into individual semiconductor assemblies or packages 500, an individual semiconductor assembly or package 500 may be transfer from the frame tape 400 to a substrate 510. For example, as shown in FIG. 13, the semiconductor assembly or package 500 may be placed (for example, by a suitable PnP process or the like) and/or mounted on the substrate 510 with the C4 bumps 310 facing and/or adjacent to a first side 512 of the substrate 510. Suitably, the substrate 510 may include one or more electrically conductive interconnects or the like which may provide electrical connections between one or more selected pads or electrical contacts or the like arranged on the first side 512 of the substrate 510 and one or more selected pads or electrical contacts or the like arranged on second side 514 of the substrate 510. In practice, the semiconductor assembly or package 500 may be place and/or mounted on the first side 512 of the substrate 510 so that the C4 bumps 310 register and/or align and/or make electrical contact with a selected one or more of the pads or electrical contacts or the like arranged on the first side 512 of the substrate 510. In some suitable embodiments, an under fill 520 may be employed, for example, to provide structural support between the substrate 510 and semiconductor assembly or package 500. In practice, any suitable under fill material and/or deposition or application process commonly employed in the manufacturing and/or packaging of semiconductors or semiconductor devices may be used to create the under fill 520.

Figure 14:
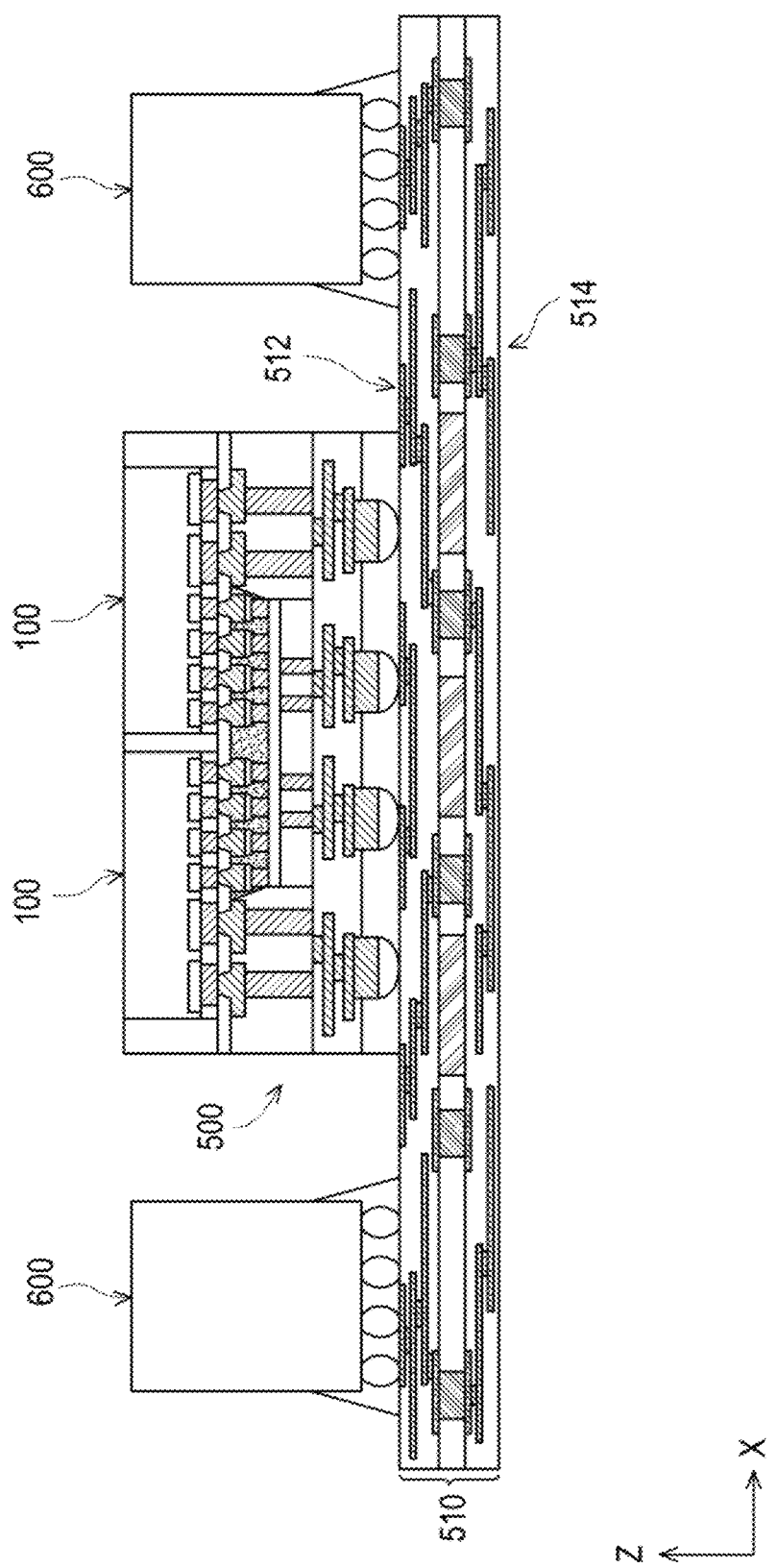

As shown in FIG. 14, one or more other semiconductor devices 600 may also be placed on, mounted and/or electrically connected to the first side 512 of the substrate 510. For example, without limitation, the other semiconductor devices 600 may be memory dies, such as DRAMs or the like.

Figure 15:
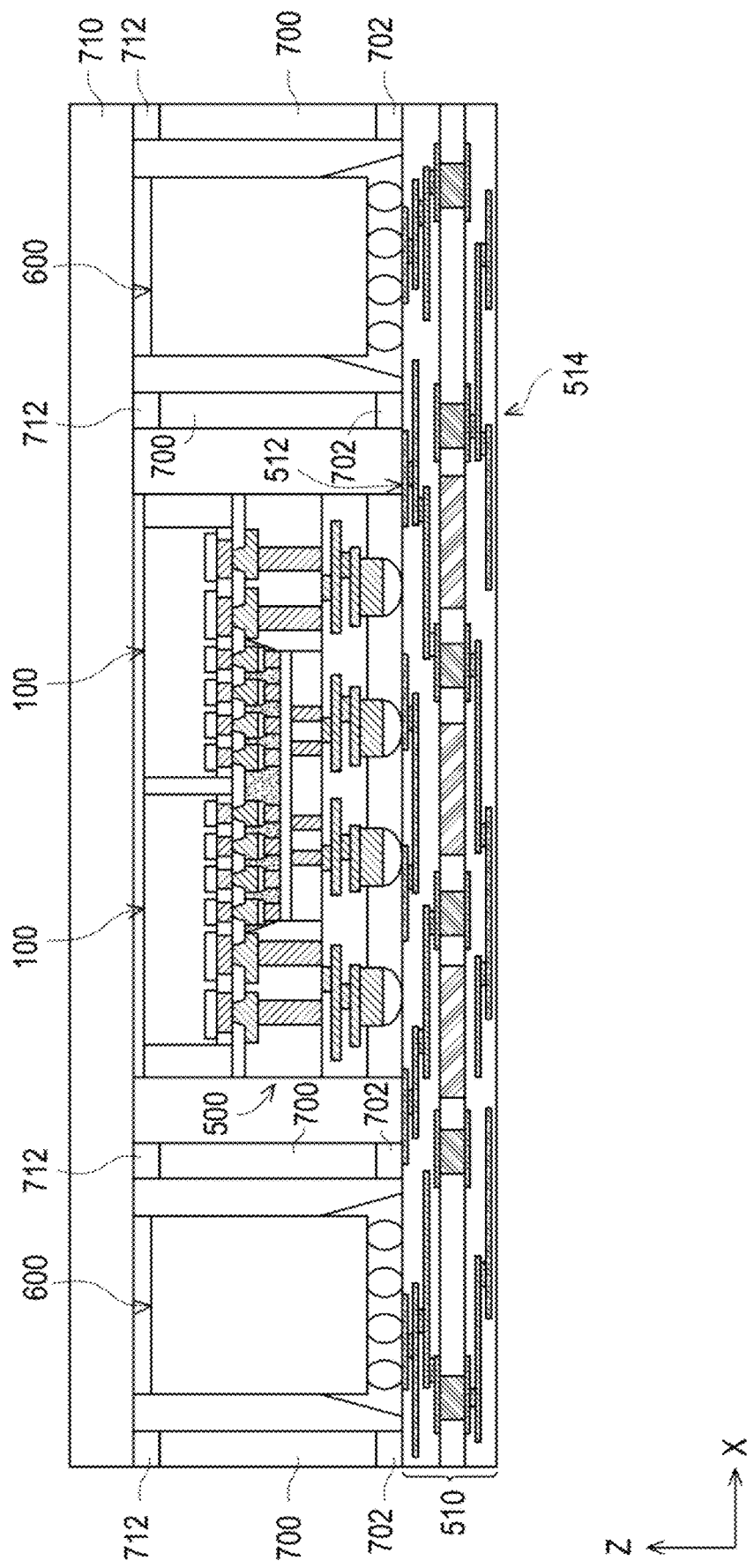

Thereafter, as shown in FIG. 15 for example, in some suitable embodiments, vertical walls or rings 700 (for example extending a direction of the Z-axis) may be placed, formed or otherwise disposed on and/or mounted to first side 512 of the substrate 510, for example, to isolate the semiconductor assembly or package 500 from the other semiconductor device 600. Suitably, an adhesive 702 may be used to secure the walls or rings 700 to the substrate 500. Additionally, as shown in FIG. 15, the semiconductor assembly or package 500 and other semiconductor devices 600 may further being enclosed by a lid 710, which may be placed on and/or mounted to a top end of the walls or rings 700, for example, secured thereto by an adhesive 712. Finally, as shown in FIG. 16, a ball grid array (BGA) 800 may be formed or otherwise disposed on the second side 514 of the substrate 500, thereby providing electrical connection points on the second side 514 of the substrate to the semiconductor assembly or package 500 and/or the other semiconductor devices 600 arranged on the second side 512 of the substrate 510, for example, through the interconnects formed in the substrate 510.

In the following, some further illustrative embodiments are described.

In some embodiments, a semiconductor device assembly includes: a first die having a first side, a first area on the first side and a second area on the first side; a second die having a second side, a third area on the second side and a fourth area on the second side; a plurality of first electrically conductive vias electrically contacting and extending away from the first side of the first die in the first area, each of the first vias having a first size; a plurality of second electrically conductive vias electrically contacting and extending away from the first side of the first die in the second area, each of the second vias having a second size, the second size being greater than the first size; a plurality of third electrically conductive vias electrically contacting and extending away from the second side of the second die in the third area, each of the third vias having a third size; a plurality of the fourth electrically conductive vias electrically contacting and extending away from the second side of the second die in the fourth area, each of the fourth vias having a fourth size, the fourth size being greater than the third size; and a silicon interconnection die disposed on the first and second sides of the first and second dies respectively, wherein the silicon interconnection die overlaps the first and second areas on the first side of the first die and the third and fourth areas on the second side of the second die and the silicon interconnection die is electrically connected such that electrical signals are selectively exchangeable between the first and second dies through at least one or more of the plurality of first vias, the plurality of second vias, the plurality of third vias and the plurality of fourth vias.

In some further embodiments, the semiconductor device assembly further includes: a plurality of fifth electrically conductive vias extending toward the first side of the first die in a fifth area on the first side of the first die, each of the fifth vias having a fifth size greater than the second size and the fifth area being distinct from the first and second areas; and a plurality of sixth electrically conductive vias extending toward the second side of the second die in a sixth area on the second side of the second die, each of the sixth vias having a sixth size greater than the fourth size and the sixth area being distinct from the third and fourth areas. Suitably, the silicon interconnection die overlaps the first, second and fifth areas on the first side of the first die and the third, fourth and sixth areas on the second side of the second die such that electrical signals are selectively exchangeable between the first and second dies through at least one or more of the plurality of first vias, the plurality of second vias, the plurality of third vias, the plurality of fourth vias, the plurality of fifth vias and the plurality of sixth vias.

In still additional embodiments, the first die has a first end; the second die has a second end, the second end of the second die facing the first end of the first die; the first area on the first side of the first die is adjacent the first end of the first die and the second area on the first side of the first die is adjacent the first area such that the first area lies between the first end of the first die and the second area; and the third area on the second side of the second die is adjacent the second end of the second die and the fourth area on the second side of the second die is adjacent the third area such that the third area lies between the second end of the second die and the fourth area.

In some embodiments, the first area has a first width measured in a first direction normal to the first end of the first die; the second area has a second width measured in the first direction, the second width being greater than the first width; the third area has a third width measured in a second direction normal to the second end of the second die; and the fourth area has a fourth width measured in the second direction, the fourth width being greater than the third width.

In yet further embodiments, the second end of the second die is spaced apart from the first end of the first die.

In some further embodiments, at least one of the first and second dies comprises a system on chip (SoC) die.

In some embodiments, the semiconductor device assembly further includes a redistribution layer (RDL) disposed over the first and second sides of the first and second dies respectively, with the silicon interconnection die positioned between the RDL and the first and second dies, the RDL redistributing one or more locations of one or more electrical connection points to at least one of the first die, the second die and the silicon interconnection die.

In yet further embodiments, a method of packaging a semiconductor includes: positioning first and second semiconductor dies next to one another on a carrier substrate, wherein a first zone and a second zone are defined with respect to the first semiconductor die and a third zone and a fourth zone are defined with respect to the second semiconductor die; forming a plurality of first electrically conductive vias in the first zone, each of the first vias having a first size; forming a plurality of second electrically conductive vias in the second zone, each of the second vias having a second size different from the first size; forming a plurality of third electrically conductive vias in the third zone, each of the third vias having a third size; forming a plurality of fourth electrically conductive vias in the fourth zone, each of the fourth vias having a fourth size different from the third size; and electrically connecting the first and second semiconductor dies with an interconnection die such that electrical signals are selectively exchangeable between the first and second semiconductor dies through at least one or more of the plurality of first vias, the plurality of second vias, the plurality of third vias and the plurality of fourth vias, the interconnection die overlapping the first, second, third and fourth zones.

In some embodiments, the method further includes: forming a plurality of fifth electrically conductive vias in a fifth zone defined with respect to the first semiconductor die, each of the fifth vias having a fifth size greater than the second size; and forming a plurality of sixth electrically conductive vias in a sixth zone defined with respect to the second semiconductor die, each of the sixth vias having a sixth size greater than the fourth size. Suitably, the first and second semiconductor dies are electrically connected to one another by the interconnection die such that electrical signals are selectively exchangeable between the first and second semiconductor dies through at least one or more of the plurality of first vias, the plurality of second vias, the plurality of third vias, the plurality of fourth vias, the plurality of fifth vias and the plurality of sixth vias; and the interconnection die overlaps the first, second, third, fourth, fifth and sixth zones.

In some further embodiments, the first semiconductor die has a first end and the second semiconductor die has a second end, and the first and second semiconductor dies are positioned on the carrier substrate such that the second end and first end face one another; the first zone is adjacent the first end and the second zone is adjacent the first zone such that the first zone lies between the first end and the second zone; and the third zone is adjacent the second end and the fourth zone is adjacent the third zone such that the third zone lies between the second end and the fourth zone.

In still further embodiments, the first zone has a first width measured in a first direction normal to the first end of the first semiconductor die; the second zone has a second width measured in the first direction, the second width being greater than the first width; the third zone has a third width measured in a second direction normal to the second end of the second semiconductor die; and the fourth zone has a fourth width measured in the second direction, the fourth width being greater than the third width.

In yet additional embodiments, the first and second semiconductor dies are positioned on the carrier substrate such that the second end of the second semiconductor die is spaced apart from the first end of the first semiconductor die.

In some further embodiments, at least one of the first and second semiconductor dies comprises a system on chip (SoC) die.

In some additional embodiments, the method further includes: forming a redistribution layer (RDL) disposed over the first and second semiconductor dies respectively, with the interconnection die positioned between the RDL and the first and second semiconductor dies, the RDL redistributing one or more locations of one or more electrical connection points to at least one of the first semiconductor die, the second semiconductor die and the interconnection die.

In some embodiments, an integrated fan-out (InFO) package for a semiconductor includes: first and second dies positioned next to one another, wherein a first zone and a second zone are defined with respect to the first die and a third zone and a fourth zone are defined with respect to the second die; a plurality of first electrically conductive vias formed in the first zone, each of the first vias having a first size; a plurality of second electrically conductive vias formed in the second zone, each of the second vias having a second size different from the first size; a plurality of third electrically conductive vias formed in the third zone, each of the third vias having a third size; a plurality of fourth electrically conductive vias formed in the fourth zone, each of the fourth vias having a fourth size different from the third size; and a local silicon interconnection (LSI) die electrically connecting the first and second dies with one another such that electrical signals are selectively exchangeable between them through at least one or more of the plurality of first vias, the plurality of second vias, the plurality of third vias and the plurality of fourth vias, the LSI die overlapping the first, second, third and fourth zones.

In some embodiments, the InFO package further includes: a plurality of fifth electrically conductive vias formed in a fifth zone defined with respect to the first die, each of the fifth vias having a fifth size greater than the second size; and a plurality of sixth electrically conductive vias formed in a sixth zone defined with respect to the second die, each of the sixth vias having a sixth size greater than the fourth size. Suitably, the first and second dies are electrically connected to one another by the LSI die such that electrical signals are selectively exchangeable between the first and second dies through at least one or more of the plurality of first vias, the plurality of second vias, the plurality of third vias, the plurality of fourth vias, the plurality of fifth vias and the plurality of sixth vias; and the LSI die overlaps the first, second, third, fourth, fifth and sixth zones.

In some further embodiments, the first die has a first end and the second die has a second end, and the first and second dies are positioned with respect to one another such that the second end and first end face and are spaced apart from one another; the first zone is adjacent the first end and the second zone is adjacent the first zone such that the first zone lies between the first end and the second zone; and the third zone is adjacent the second end and the fourth zone is adjacent the third zone such that the third zone lies between the second end and the fourth zone.

In still further embodiments, the first zone has a first width measured in a first direction normal to the first end of the first die; the second zone has a second width measured in the first direction, the second width being greater than the first width; the third zone has a third width measured in a second direction normal to the second end of the second die; and the fourth zone has a fourth width measured in the second direction, the fourth width being greater than the third width.

In yet further embodiments, at least one of the first and second dies comprises a system on chip (SoC) die.

In still one more embodiment, the InFO package further includes: a redistribution layer (RDL) disposed over the first and second dies respectively, with the LSI die positioned between the RDL and the first and second dies, the RDL redistributing one or more locations of one or more electrical connection points to at least one of the first die, the second die and the LSI die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device assembly comprising:
   a first die having a first side, a first area on the first side and a second area on the first side;
   a second die having a second side, a third area on the second side and a fourth area on the second side;
   a plurality of first electrically conductive vias electrically contacting and extending away from the first side of the first die in the first area, each of the first vias having a first size;
   a plurality of second electrically conductive vias electrically contacting and extending away from the first side of the first die in the second area, each of the second vias having a second size, the second size being greater than the first size;
   a plurality of third electrically conductive vias electrically contacting and extending away from the second side of the second die in the third area, each of the third vias having a third size;
   a plurality of the fourth electrically conductive vias electrically contacting and extending away from the second side of the second die in the fourth area, each of the fourth vias having a fourth size, the fourth size being greater than the third size; and a silicon interconnection die disposed on the first and second sides of the first and second dies respectively, wherein the silicon interconnection die overlaps the first and second areas on the first side of the first die and the third and fourth areas on the second side of the second die and the silicon interconnection die is electrically connected such that electrical signals are selectively exchangeable between the first and second dies through at least one or more of the plurality of first vias, the plurality of second vias, the plurality of third vias and the plurality of fourth vias.

2. The semiconductor device assembly of claim 1, further comprising:

a plurality of fifth electrically conductive vias extending toward the first side of the first die in a fifth area on the first side of the first die, each of the fifth vias having a fifth size greater than the second size and the fifth area being distinct from the first and second areas; and a plurality of sixth electrically conductive vias extending toward the second side of the second die in a sixth area on the second side of the second die, each of the sixth vias having a sixth size greater than the fourth size and the sixth area being distinct from the third and fourth areas;

wherein the silicon interconnection die overlaps the first, second and fifth areas on the first side of the first die and the third, fourth and sixth areas on the second side of the second die such that electrical signals are selectively exchangeable between the first and second dies through at least one or more of the plurality of first vias, the plurality of second vias, the plurality of third vias, the plurality of fourth vias, the plurality of fifth vias and the plurality of sixth vias.

3. The semiconductor device assembly of claim 1, wherein:

the first die has a first end;

the second die has a second end, the second end of the second die facing the first end of the first die;

the first area on the first side of the first die is adjacent the first end of the first die and the second area on the first side of the first die is adjacent the first area such that the first area lies between the first end of the first die and the second area; and the third area on the second side of the second die is adjacent the second end of the second die and the fourth area on the second side of the second die is adjacent the third area such that the third area lies between the second end of the second die and the fourth area.

4. The semiconductor device assembly of claim 3, wherein:

the first area has a first width measured in a first direction normal to the first end of the first die;

the second area has a second width measured in the first direction, the second width being greater than the first width;

the third area has a third width measured in a second direction normal to the second end of the second die; and the fourth area has a fourth width measured in the second direction, the fourth width being greater than the third width.

5. The semiconductor device assembly of claim 3, wherein the second end of the second die is spaced apart from the first end of the first die.

6. The semiconductor device assembly of claim 1, wherein at least one of the first and second dies comprises a system on chip (SoC) die.

7. The semiconductor device assembly of claim 1, further comprising:

a redistribution layer (RDL) disposed over the first and second sides of the first and second dies respectively, with the silicon interconnection die positioned between the RDL and the first and second dies, the RDL redistributing one or more locations of one or more electrical connection points to at least one of the first die, the second die and the silicon interconnection die.

8. A method of packaging a semiconductor comprising:

positioning first and second semiconductor dies next to one another on a carrier substrate, wherein a first zone and a second zone are defined with respect to the first semiconductor die and a third zone and a fourth zone are defined with respect to the second semiconductor die;

forming a plurality of first electrically conductive vias in the first zone, each of the first vias having a first size;

forming a plurality of second electrically conductive vias in the second zone, each of the second vias having a second size different from the first size;

forming a plurality of third electrically conductive vias in the third zone, each of the third vias having a third size;

forming a plurality of fourth electrically conductive vias in the fourth zone, each of the fourth vias having a fourth size different from the third size; and electrically connecting the first and second semiconductor dies with an interconnection die such that electrical signals are selectively exchangeable between the first and second semiconductor dies through at least one or more of the plurality of first vias, the plurality of second vias, the plurality of third vias and the plurality of fourth vias, the interconnection die overlapping the first, second, third and fourth zones.

9. The method of claim 8, further comprising:

forming a plurality of fifth electrically conductive vias in a fifth zone defined with respect to the first semiconductor die, each of the fifth vias having a fifth size greater than the second size; and forming a plurality of sixth electrically conductive vias in a sixth zone defined with respect to the second semiconductor die, each of the sixth vias having a sixth size greater than the fourth size;

wherein the first and second semiconductor dies are electrically connected to one another by the interconnection die such that electrical signals are selectively exchangeable between the first and second semiconductor dies through at least one or more of the plurality of first vias, the plurality of second vias, the plurality of third vias, the plurality of fourth vias, the plurality of fifth vias and the plurality of sixth vias; and the interconnection die overlaps the first, second, third, fourth, fifth and sixth zones.

10. The method of claim 8, wherein:

the first semiconductor die has a first end and the second semiconductor die has a second end, and the first and second semiconductor dies are positioned on the carrier substrate such that the second end and first end face one another;

the first zone is adjacent the first end and the second zone is adjacent the first zone such that the first zone lies between the first end and the second zone; and the third zone is adjacent the second end and the fourth zone is adjacent the third zone such that the third zone lies between the second end and the fourth zone.

11. The method of claim 10, wherein:
the first zone has a first width measured in a first direction normal to the first end of the first semiconductor die;
the second zone has a second width measured in the first direction, the second width being greater than the first width;
the third zone has a third width measured in a second direction normal to the second end of the second semiconductor die; and
the fourth zone has a fourth width measured in the second direction, the fourth width being greater than the third width.

12. The method of claim 10, wherein the first and second semiconductor dies are positioned on the carrier substrate such that the second end of the second semiconductor die is spaced apart from the first end of the first semiconductor die.

13. The method of claim 8, wherein at least one of the first and second semiconductor dies comprises a system on chip (SoC) die.

14. The method of claim 8, further comprising:
forming a redistribution layer (RDL) disposed over the first and second semiconductor dies respectively, with the interconnection die positioned between the RDL and the first and second semiconductor dies, the RDL redistributing one or more locations of one or more electrical connection points to at least one of the first semiconductor die, the second semiconductor die and the interconnection die.

15. An integrated fan-out (InFO) package for a semiconductor comprising:
first and second dies positioned next to one another, wherein a first zone and a second zone are defined with respect to the first die and a third zone and a fourth zone are defined with respect to the second die;
a plurality of first electrically conductive vias formed in the first zone, each of the first vias having a first size;
a plurality of second electrically conductive vias formed in the second zone, each of the second vias having a second size different from the first size;
a plurality of third electrically conductive vias formed in the third zone, each of the third vias having a third size;
a plurality of fourth electrically conductive vias formed in the fourth zone, each of the fourth vias having a fourth size different from the third size; and
a local silicon interconnection (LSI) die electrically connecting the first and second dies with one another such that electrical signals are selectively exchangeable between them through at least one or more of the plurality of first vias, the plurality of second vias, the plurality of third vias and the plurality of fourth vias, the LSI die overlapping the first, second, third and fourth zones.

16. The inFO package of claim 15, further comprising:
a plurality of fifth electrically conductive vias formed in a fifth zone defined with respect to the first die, each of the fifth vias having a fifth size greater than the second size; and
a plurality of sixth electrically conductive vias formed in a sixth zone defined with respect to the second die, each of the sixth vias having a sixth size greater than the fourth size;
wherein the first and second dies are electrically connected to one another by the LSI die such that electrical signals are selectively exchangeable between the first and second dies through at least one or more of the plurality of first vias, the plurality of second vias, the plurality of third vias, the plurality of fourth vias, the plurality of fifth vias and the plurality of sixth vias; and
wherein the LSI die overlaps the first, second, third, fourth, fifth and sixth zones.

17. The InFO package of claim 15, wherein:
the first die has a first end and the second die has a second end, and the first and second dies are positioned with respect to one another such that the second end and first end face and are spaced apart from one another;
the first zone is adjacent the first end and the second zone is adjacent the first zone such that the first zone lies between the first end and the second zone; and
the third zone is adjacent the second end and the fourth zone is adjacent the third zone such that the third zone lies between the second end and the fourth zone.

18. The InFO package of claim 17, wherein:
the first zone has a first width measured in a first direction normal to the first end of the first die;
the second zone has a second width measured in the first direction, the second width being greater than the first width;
the third zone has a third width measured in a second direction normal to the second end of the second die; and
the fourth zone has a fourth width measured in the second direction, the fourth width being greater than the third width.

19. The InFO package of claim 15, wherein at least one of the first and second dies comprises a system on chip (SoC) die.

20. The InFO package of claim 15, further comprising:
a redistribution layer (RDL) disposed over the first and second dies respectively, with the LSI die positioned between the RDL and the first and second dies, the RDL redistributing one or more locations of one or more electrical connection points to at least one of the first die, the second die and the LSI die.

* * * * *